(12) United States Patent
Quevy et al.

(10) Patent No.: US 7,923,790 B1
(45) Date of Patent: *Apr. 12, 2011

(54) PLANAR MICROSHELLS FOR VACUUM ENCAPSULATED DEVICES AND DAMASCENE METHOD OF MANUFACTURE

(75) Inventors: Emmanuel P. Quevy, El Cerrito, CA (US); Pezhman Monadgemi, Fremont, CA (US); Roger T. Howe, Los Gatos, CA (US)

(73) Assignee: Silicon Laboratories Inc., Austin, TX (US)

( * ) Notice: Subject to any disclaimer, the term of this patent is extended or adjusted under 35 U.S.C. 154(b) by 715 days.

This patent is subject to a terminal disclaimer.

(21) Appl. No.: 11/716,070

(22) Filed: Mar. 9, 2007

(51) Int. Cl.
*H01L 29/84* (2006.01)

(52) U.S. Cl. ........ 257/415; 257/414; 257/416; 257/417; 257/E23.193; 438/48; 438/49; 438/53; 438/125; 438/126; 438/127

(58) Field of Classification Search .................. 257/414, 257/415, 416, 417, E23.193; 438/48, 49, 438/53, 125, 126, 127
See application file for complete search history.

(56) References Cited

U.S. PATENT DOCUMENTS

| | | | |
|---|---|---|---|
| 4,838,088 A | 6/1989 | Murakami | 73/724 |
| 5,188,983 A | 2/1993 | Guckel et al. | 437/209 |
| 5,470,797 A | 11/1995 | Mastrangelo | |
| 5,589,082 A | 12/1996 | Lin et al. | 216/2 |
| 5,893,974 A | 4/1999 | Keller et al. | 210/483 |
| 5,919,364 A | 7/1999 | Lebouitz et al. | 210/321.84 |
| 5,919,548 A | 7/1999 | Barron et al. | 428/138 |
| 6,160,705 A | 12/2000 | Stearns et al. | |
| 6,197,691 B1 | 3/2001 | Lee | |
| 6,210,988 B1 | 4/2001 | Howe et al. | 438/50 |
| 6,335,224 B1 | 1/2002 | Peterson et al. | 438/114 |
| 6,429,755 B2 | 8/2002 | Speidell et al. | 333/197 |
| 6,499,354 B1 | 12/2002 | Najafi et al. | 73/723 |
| 6,613,241 B1 | 9/2003 | Scherer et al. | 216/52 |
| 6,635,509 B1 | 10/2003 | Ouellet | 438/106 |
| 6,844,214 B1 | 1/2005 | Mei et al. | |

(Continued)

FOREIGN PATENT DOCUMENTS

WO    WO-2005/061376 A1    7/2005

(Continued)

OTHER PUBLICATIONS

USPTO, "Notice of Allowance for U.S. Appl. No. 11/716,422", mailed Jan. 29, 2010, Whole Document.

(Continued)

*Primary Examiner* — Andy Huynh
(74) *Attorney, Agent, or Firm* — O'Keefe, Egan, Peterman & Enders LLP

(57) ABSTRACT

Low temperature, multi-layered, planar microshells for encapsulation of devices such as MEMS and microelectronics. The microshells include a planar perforated pre-sealing layer, below which a non-planar sacrificial layer is accessed, and a sealing layer to close the perforation in the pre-sealing layer after the sacrificial material is removed. In an embodiment, the pre-sealing layer has perforations formed with a damascene process to be self-aligned to the chamber below the microshell. The sealing layer may include a nonhermetic layer to physically occlude the perforation and a hermetic layer over the nonhermetic occluding layer to seal the perforation. In a particular embodiment, the hermetic layer is a metal which is electrically coupled to a conductive layer adjacent to the microshell to electrically ground the microshell.

54 Claims, 23 Drawing Sheets

U.S. PATENT DOCUMENTS

| | | | |
|---|---|---|---|
| 6,897,551 B2 | 5/2005 | Amiotti | 257/682 |
| 6,902,656 B2 | 6/2005 | Ouellet et al. | 204/192.16 |
| 6,923,625 B2 | 8/2005 | Sparks | 417/48 |
| 6,936,494 B2 | 8/2005 | Cheung | 438/55 |
| 6,953,985 B2 | 10/2005 | Lin et al. | 257/659 |
| 6,988,789 B2 | 1/2006 | Silverbrook | |
| 6,991,953 B1 | 1/2006 | Bruner et al. | 438/29 |
| 7,002,436 B2 | 2/2006 | Ma et al. | 333/186 |
| 7,008,812 B1 | 3/2006 | Carley | 438/52 |
| 7,029,829 B2 | 4/2006 | Stark et al. | 430/320 |
| 7,045,958 B2 | 5/2006 | Ramamoorthi et al. | |
| 7,061,099 B2 * | 6/2006 | Lu et al. | 257/704 |
| 7,074,636 B2 | 7/2006 | Curtis et al. | 438/50 |
| 7,075,160 B2 | 7/2006 | Partridge et al. | 257/414 |
| 7,078,268 B1 | 7/2006 | Geosling | 438/115 |
| 7,115,436 B2 | 10/2006 | Lutz et al. | 438/48 |
| 7,344,907 B2 * | 3/2008 | Colgan et al. | 438/51 |
| 7,595,209 B1 | 9/2009 | Monadgemi et al. | |
| 7,648,859 B2 * | 1/2010 | Robert | 438/127 |
| 7,659,150 B1 * | 2/2010 | Monadgemi et al. | 438/125 |
| 7,736,929 B1 | 6/2010 | Monadgemi et al. | |
| 2002/0151100 A1 | 10/2002 | Coffa et al. | |
| 2003/0148550 A1 | 8/2003 | Volant et al. | |
| 2004/0196608 A1 | 10/2004 | Anderson et al. | |
| 2004/0224091 A1 | 11/2004 | Rusu et al. | 427/255.28 |
| 2005/0179099 A1 | 8/2005 | Lutz et al. | |
| 2005/0250236 A1 | 11/2005 | Takeuchi et al. | 438/48 |
| 2006/0017533 A1 | 1/2006 | Jahnes et al. | |
| 2006/0063462 A1 | 3/2006 | Ding et al. | |
| 2006/0108652 A1 | 5/2006 | Patridge et al. | |
| 2006/0108675 A1 | 5/2006 | Colgan et al. | 257/684 |
| 2006/0148137 A1 | 7/2006 | Hartzell et al. | 438/149 |
| 2006/0228869 A1 | 10/2006 | Haluzak et al. | 438/458 |
| 2007/0013268 A1 | 1/2007 | Kubo et al. | |
| 2007/0298238 A1 | 12/2007 | Witvrouw et al. | |

FOREIGN PATENT DOCUMENTS

| | | |
|---|---|---|
| WO | WO-2006/081636 A1 | 8/2006 |

OTHER PUBLICATIONS

Jahnes, C. V., et al., "Simultaneous Fabrication of RF MEMS Switches and Resonators Using Copper-Based CMOS Interconnect Manufacturing Methods", IEEE, 2004, pp. 789-792.

Lund, J., et al., "A Low Temperature Bi-CMOS Compatible Process for MEMS RF Resonators and Filters", *Digest Solid-State Sensors and Actuators Workshop*, Hilton Head, South Carolina, (2002), p. 38-41.

USPTO, "Office Action for U.S. Appl. No. 11/716,156", mailed Mar. 17, 2009, Whole document.

USPTO "Office Action for U.S. Appl. No. 11/716,233", mailed Dec. 29, 2008, Whole document.

USPTO, "Notice of Allowance for U.S. Appl. No. 11/716,233", mailed May 22, 2009, Whole document.

USPTO, "Notice of Allowance for U.S. Appl. No. 11/716,156", mailed Aug. 11, 2009, Whole document.

USPTO, "Office Action for U.S. Appl. No. 11/716,422", (Aug. 17, 2009), Whole document.

Monadgemi et al., "Low Stress Thin Film Microshells", U.S. Appl. No. 11/716,233, Office Action, Oct. 28, 2008, 6 pgs.

Monadgemi et al., "Low Stress Thin Film Microshells", U.S. Appl. No. 11/716,233, Response To Restriction Requirement, Nov. 25, 2008, 7 pgs.

Monadgemi et al., "Low Stress Thin Film Microshells", U.S. Appl. No. 11/716,233, Response To Office Action, Mar. 30, 2009, 10 pgs.

Monadgemi et al., "Microshells For Multi-Level Vacuum Cavities", U.S. Appl. No. 11/716,156, Office Action, Jan. 7, 2009, 7 pgs.

Monadgemi et al., "Microshells For Multi-Level Vacuum Cavities", U.S. Appl. No. 11/716,156, Response To Restriction Requirement, Feb. 9, 2009, 7 pgs.

Monadgemi et al., "Microshells For Multi-Level Vacuum Cavities", U.S. Appl. No. 11/716,156, Response To Office Action, Jun. 12, 2009, 9 pgs.

Monadgemi et al., "Microshells For Multi-Level Vacuum Cavities", U.S. Appl. No. 11/716,156, Amendment Under 37 CFR 1.312, Nov. 11, 2009, 6 pgs.

Monadgemi et al, "Thin Film Microshells Incorporating A Getter Layer", U.S. Appl. No. 11/716,422, Office Action, Jun. 16, 2009, 6 pgs.

Monadgemi et al, "Thin Film Microshells Incorporating A Getter Layer", U.S. Appl. No. 11/716,422, Response To Restriction Requirement, Jul. 14, 2009, 6 pgs.

Monadgemi et al, "Thin Film Microshells Incorporating A Getter Layer", U.S. Appl. No. 11/716,422, Response To Office Action, Nov. 17, 2009, 9 pgs.

* cited by examiner

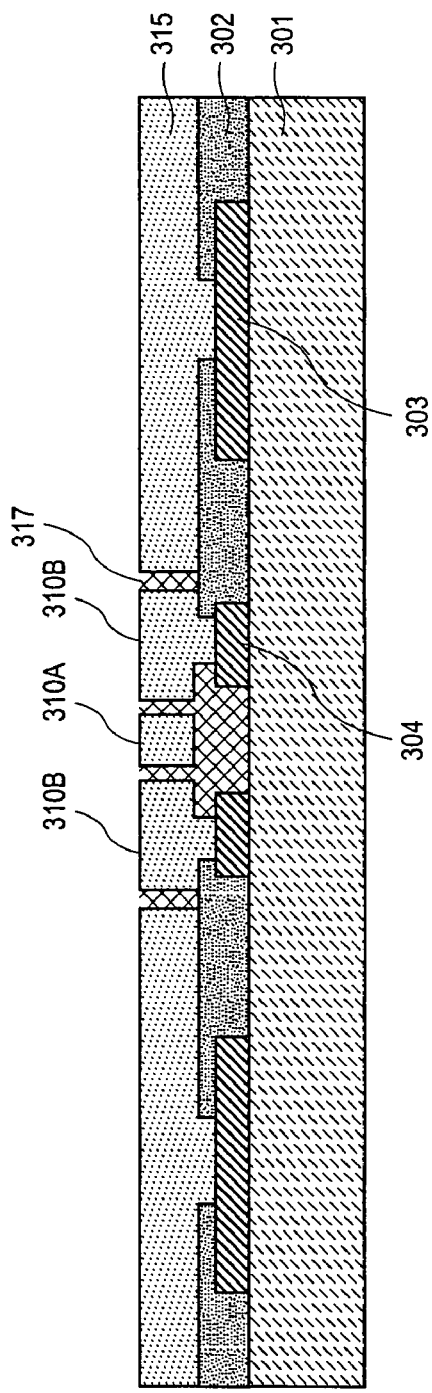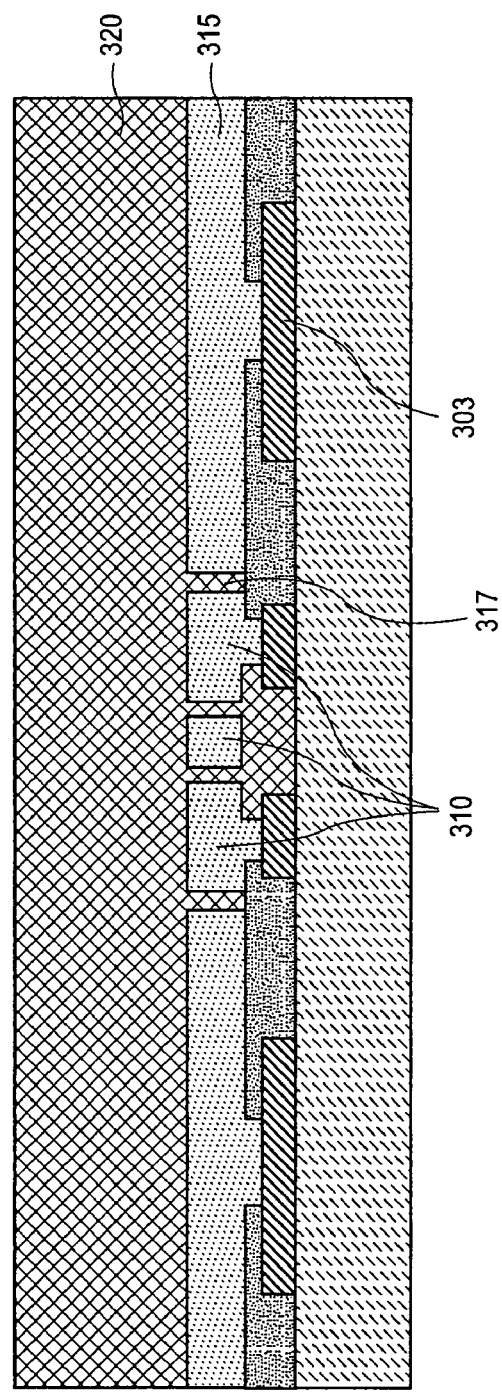
FIG. 3A
FIG. 3B

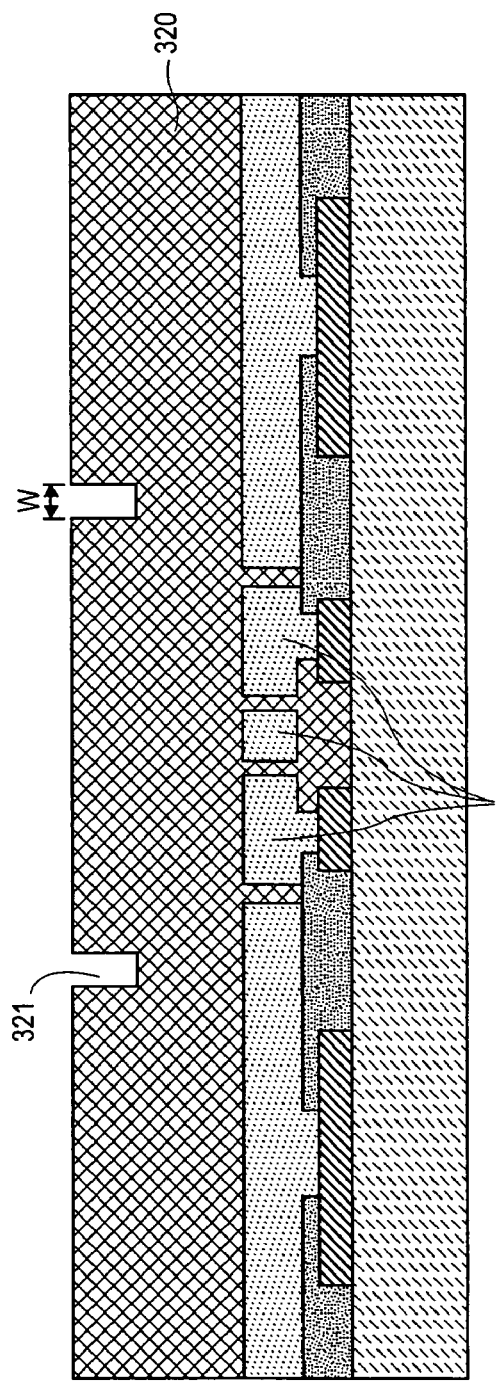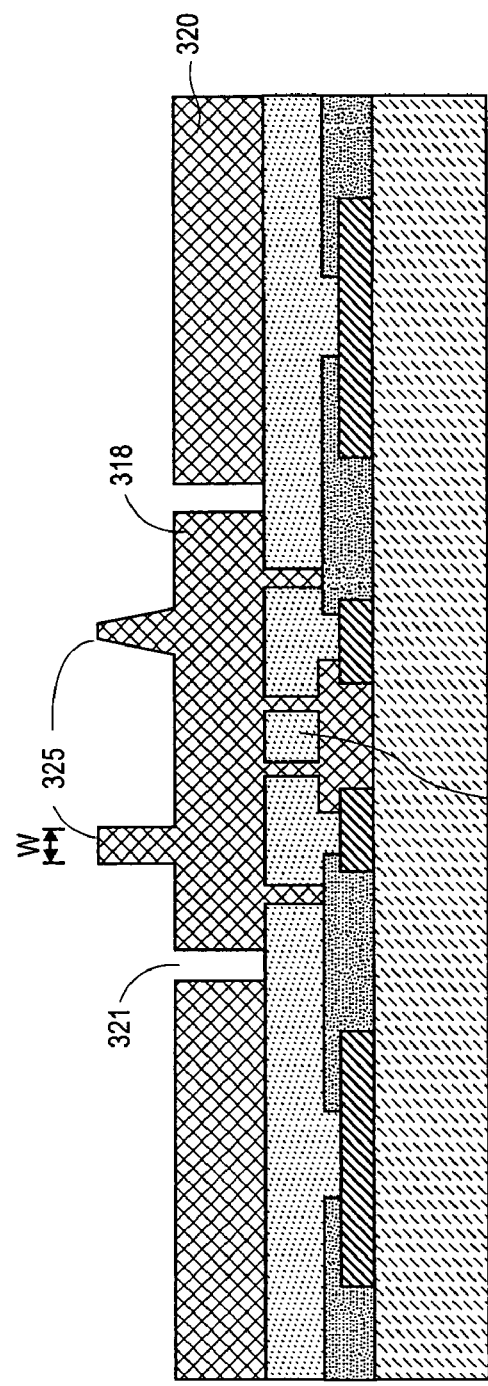

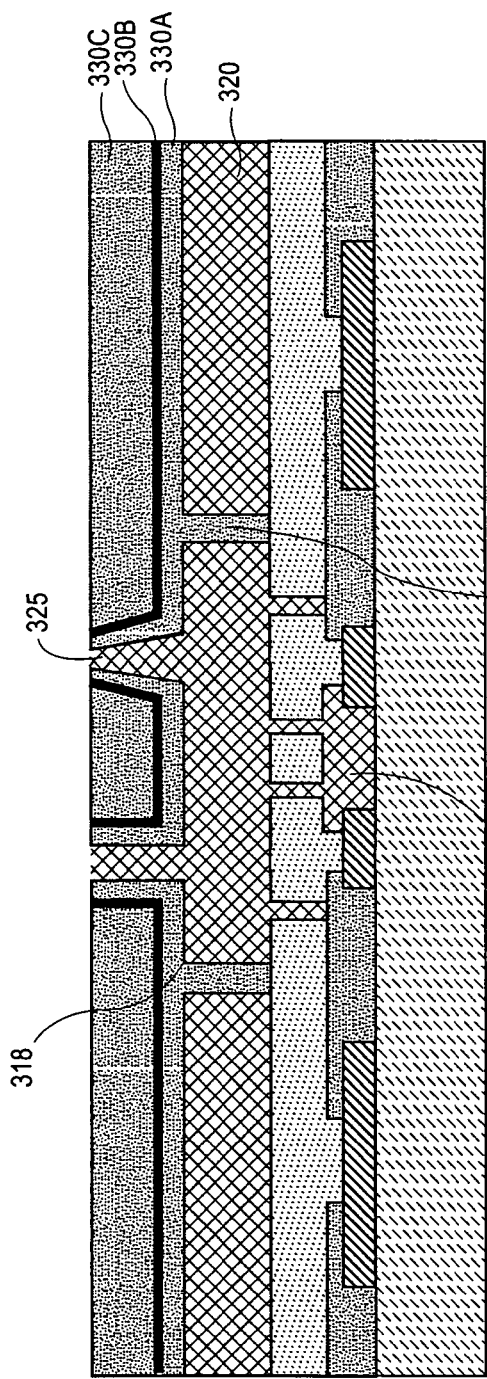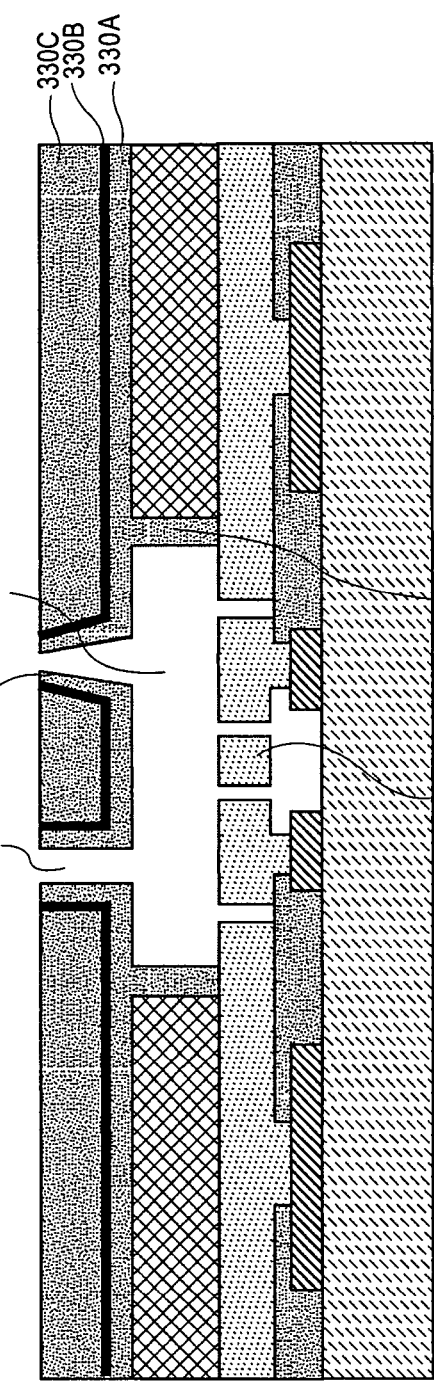
FIG. 3G
FIG. 3H

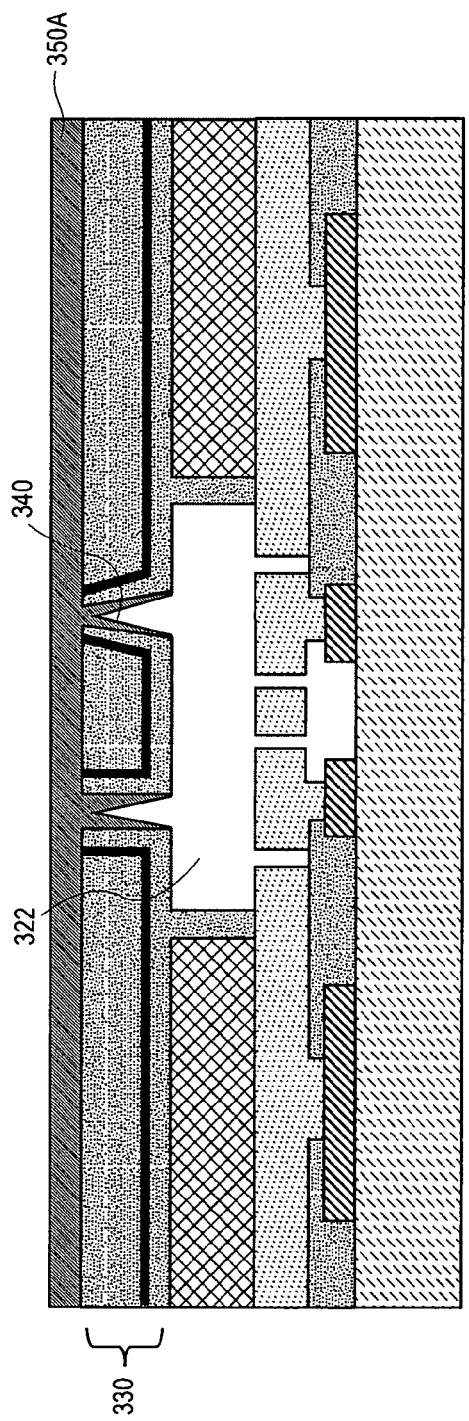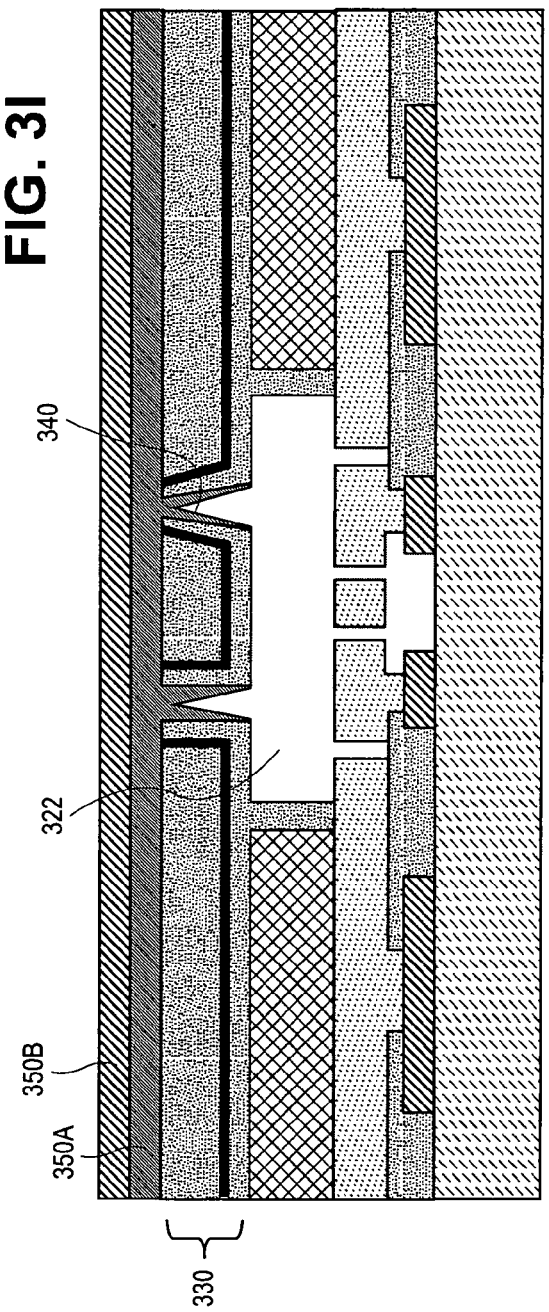

PLANAR MICROSHELLS FOR VACUUM ENCAPSULATED DEVICES AND DAMASCENE METHOD OF MANUFACTURE

CROSS-REFERENCE TO RELATED APPLICATIONS

This patent application is related to the following U.S. patent applications:

Non-provisional patent application entitled "Thin Film Microshells Incorporating a Getter Layer" having Ser. No. 11/716,422, filed the same day as this patent application.

Non-provisional patent application entitled "Low Stress Thin Film Microshell" having Ser. No. 11/716,233, filed the same day as this patent application.

Non-provisional patent application entitled "Thin Film Microshell for Multi-level Vacuum Cavities" having Ser. No. 11/716,156, filed the same day as this patent application.

BACKGROUND

1. Field

The present invention relates to the field of manufacturing of microelectronic devices and microelectromechanical systems (MEMS), and more particularly to the formation of microshells to encapsulate such devices on a substrate.

2. Discussion of Related Art

The term "MEMS" generally refers to an apparatus incorporating some mechanical structure having a dimensional scale that is comparable to microelectronic devices. This mechanical structure is typically capable of some form of mechanical motion and having dimensions below approximately 250 um. Micro-scale fabrication techniques similar to those utilized in the microelectronic industry such as thin film deposition, and thin film patterning by photolithography and reactive ion etching (RIE) form the micromechanical structure in a MEMS.

Many devices, particularly MEMS do not function properly when embedded in a completely solid environment. For example, a MEMS may comprise a resonator or accelerometer fabricated on a substrate, both of which include at least one element that must mechanically move relative to the substrate during operation. Freedom to move during operation would be lost if these elements were simply left embedded in a solid film deposited over the substrate as is commonly done in the microelectronics industry. For this reason, a micromechanical structure must be released from the substrate so that it is not contained within a purely solid environment. A released micromechanical structure is fragile and must be protected with some form of package which isolates a microenvironment surrounding the micromechanical structure from a global environment surrounding the substrate. The package may further be hermetically sealed so that it can remain evacuated or pressurized with a gas or other fluidic media. Similarly, some microelectronic devices (devoid of micromechanical structures) can also benefit from being contained within an isolated micro-environment. For example, a high speed transistor may be suspended in a manner so that it is substantially surrounded by a partial vacuum contained within a chamber so as to reduce parasitic capacitances associated with the relatively high dielectric constant of most solid materials. The type of package employed for such a MEMS or microelectronic device greatly affects their cost and functionality.

One option is encapsulating a device in a conventional "TO can," well-known in the industry as a standard packaging method for a discrete device. This type of packaging is not wafer-level and is limited to stand-alone (discrete) devices, and therefore is expensive. Another packaging option is the microcap 100 shown in FIG. 1A. Here, first substrate 102 supports device 101. A thick film or second substrate 105 is first aligned and then bonded to first substrate 102 by means of seal ring 110 to form a cap over device 101. Fabrication of microcap packages of the type shown is frequently more expensive than the fabrication of the devices they protect. Fabrication and alignment of second substrate 105 is costly and, as shown, seal ring 110 requires a significant amount of die area, thereby increasing the cost by limiting the minimum dimension of the package. For example, the size of microcap 100, after accommodating packaging alignment and seal ring area, can be nearly twice the area of device 101. Thus, the microcap package limits the scaling of the packaged device, accounts for a large percentage of the packaged device cost and limits wafer-level integration of devices requiring a fluidic environment with those that do not.

Another option is a conventional thin film encapsulated package 150 as shown in FIG. 1B. Here, thin films, such as a low pressure chemical vapor deposition (LPCVD) polycrystalline silicon (polysilicon) or silicon nitride ($Si_3N_4$), cover device 101. Unlike the microcap package previously discussed, encapsulation by thin films does not require large seal rings or thick substrate caps and so are commonly referred to as "microshells." A microshell typically comprises a thin film layer having a perforation and a thin film sealing layer. As shown in FIG. 1B, perforated layer 115 has a perforation 116 from which a sacrificial layer under the perforated layer 115 is removed to expose device 101. Sealing layer 120 then closes perforation 116 to complete the microshell.

Because a thin film is utilized rather than a thick film or substrate, no seal ring is required and misalignment issues are reduced relative to the bonded-cover package. However, one issue with the conventional microshells is that the pressure inside the microshell is not controllable as in the microcap bonding process. Conventional microshells typically rely solely on a sealing layer 120 of silicon dioxide. Sealing the microshell with a silicon dioxide process typically limits the level of vacuum that can be achieved within the microshell and can result in contamination on the encapsulated device. Furthermore, conventional microshells are not as robust as bonded microcap packages and so, as the chamber size is increased, are not readily capable of withstanding the pressure of the final package molding process employed in conventional microelectronics, which is on the order of 1000 pounds per square inch (PSI). Therefore, the cost of the final package encompassing the conventional microshell can remain high. For this reason too, it is not easy to monolithically integrate a conventional microshell with microelectronic devices (eg. CMOS).

Still another limitation of conventional microshells is that non-conventional processes are typically employed which either increase costs or render the package incompatible with microelectronics. For example, accessing the sacrificial layer is typically by way of a high aspect ratio perforation 116 that is first lithographically patterned and then etched through a non-porous pre-sealing layer. This etching of high aspect ratio perforations 116 through a non-porous pre-sealing layer can be very difficult because non-planarity, as shown in FIG. 1B, limits the minimum resolvable aperture diameter for a given exposure wavelength. Moreover, process difficulties associated with etching high aspect ratio apertures (such as etch stop, etc.) increase the cost of forming the high aspect ratio perforation 116 in conventional thin film encapsulated package 150.

Furthermore, many conventional microshells require high temperature processing that is incompatible with microelectronic devices. For example microshells incorporating silicon, such as monocrystalline or polycrystalline silicon, to either form perforated layer 116 or sealing layer 120 require processing temperatures greater than 600° C. Such high temperature processes forecloses the formation of a conventional microshell subsequent to the formation of many microelectronic and/or MEMS. Because modern CMOS transistors typically have a low thermal budget, any processing of a significant duration at much over 650° C. will degrade transistor performance. Thus, integration of a microshell with CMOS can not easily be accomplished. Therefore, high temperature microshell fabrication requires the microshell to be made prior to any transistor fabrication. Thus, monolithically integrating the conventional microshell with microelectronics is again severely limited.

BRIEF DESCRIPTION OF THE DRAWINGS

FIGS. 3A-3D are cross-sectional views of a microshell at various stages of fabrication in accordance with an embodiment of the present invention.

FIGS. 3F-3L are cross-sectional views of the microshell depicted in FIGS. 3A-3E at subsequent stages of fabrication in accordance with an embodiment of the present invention.

DETAILED DESCRIPTION OF THE PRESENT INVENTION

Figure 1A:
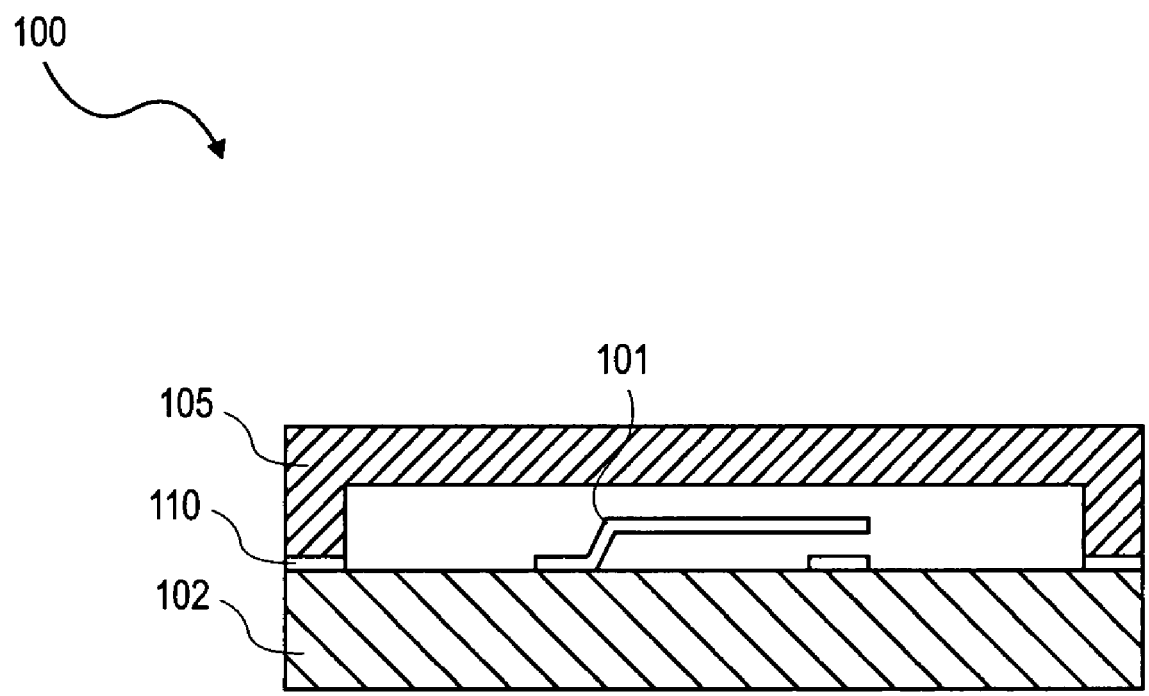
FIG. 1A is an illustration of a cross-sectional view of a conventional package utilizing a bonding of two substrates.
Figure 1B:
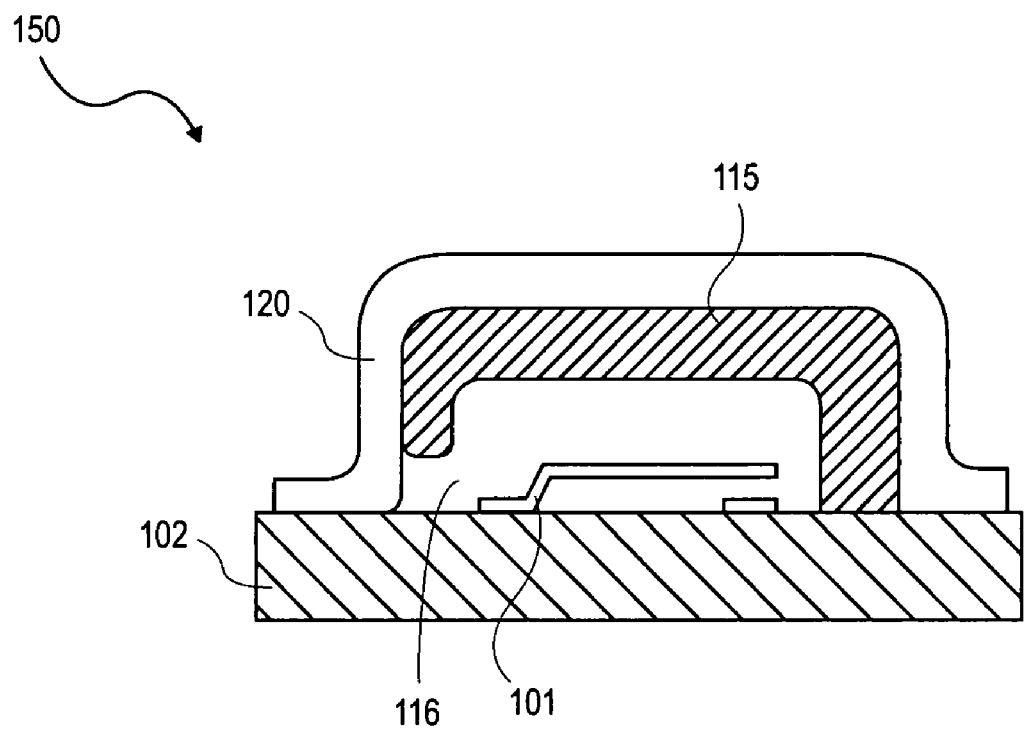
FIG. 1B is an illustration of a cross-sectional view of a convention microshell.

In various embodiments, microshells are described herein with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known manufacturing processes and techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Embodiments of the present invention are low temperature, multi-layered, planar microshells for encapsulation of devices such as MEMS and microelectronics. The microshells described provide a covering over a chamber on a localized region of a substrate to protect a device disposed within the chamber. The microshells described may provide an evacuated or pressurized chamber. Generally, the microshells of the present invention include a planar perforated pre-sealing layer, below which a non-planar sacrificial layer is accessed, and a sealing layer to close the perforation in the pre-sealing layer after the sacrificial material is removed. In an embodiment, the pre-sealing layer has perforations formed with a damascene process to be self-aligned to the chamber below the microshell. In certain embodiments, the perforations have very high aspect ratios and/or highly re-entrant profiles. In another embodiment, the pre-sealing layer further includes a large surface area getter layer to remove contaminants from the space ultimately enclosed by the microshell. In still another embodiment, the sealing layer includes a nonhermetic layer to physically occlude the perforation and a hermetic layer over the nonhermetic occluding layer to seal the perforation. In a particular embodiment, the hermetic layer is a metal which is electrically coupled to a conductive layer adjacent to the microshell to electrically ground the microshell. In a further embodiment, the sealing layer is formed in a manner to provide different levels of vacuum between two different microshells formed on the same substrate. In yet another embodiment, the microshell is reinforced with a cap of low temperature semiconductor, such as silicon germanium, over the hermetic layer. In a further embodiment, the residual stress of the microshell is tuned by countering the stress of pre-sealing layer with an opposing stress in the sealing layer. In another embodiment, the microshell is physically coupled to a MEMS disposed therein. In still another embodiment, a plurality of MEMS are disposed within a single microshell. In yet another embodiment, the microshell anchors a released interconnect forming a capacitor, inductor, or transmission line.

Figure 2A:
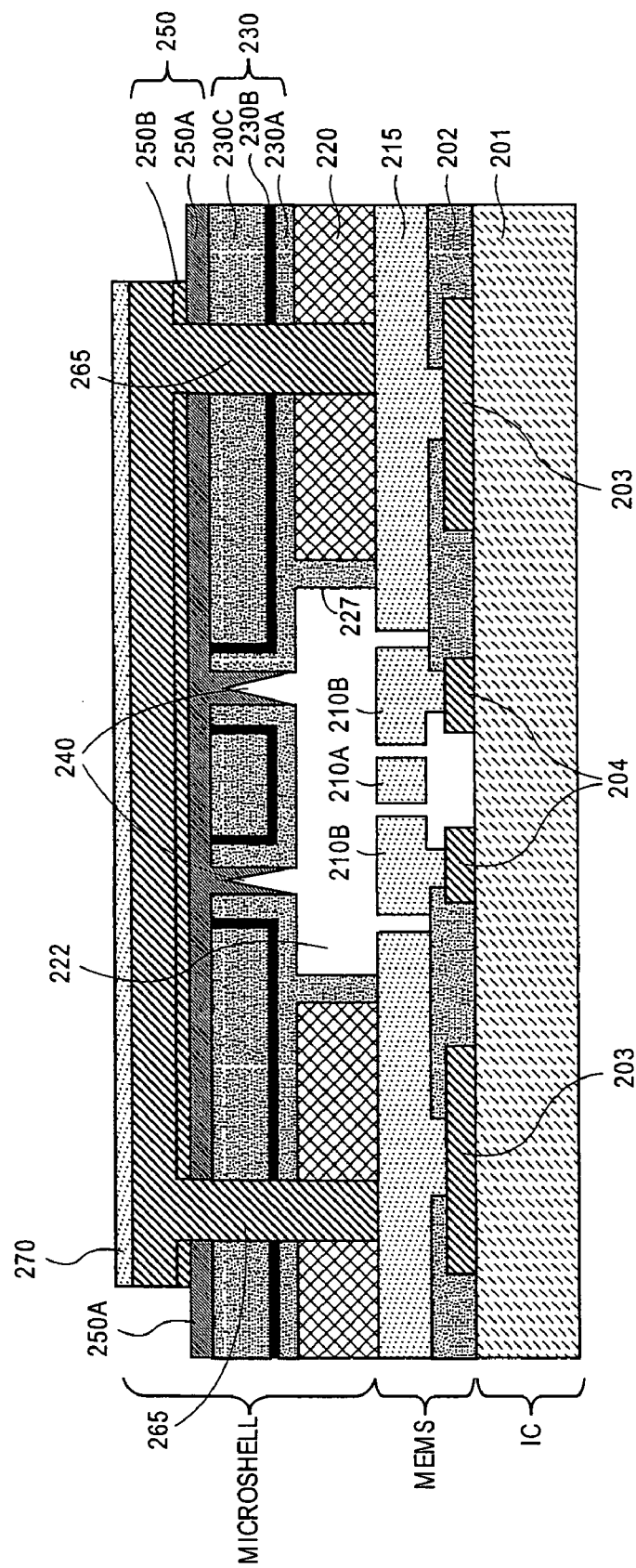
FIGS. 2A-2B are illustrations of a cross-sectional view and a plan view, respectively, of a microshell encapsulating a MEMS disposed within the chamber in accordance with an embodiment of the present invention.
Figure 2B:
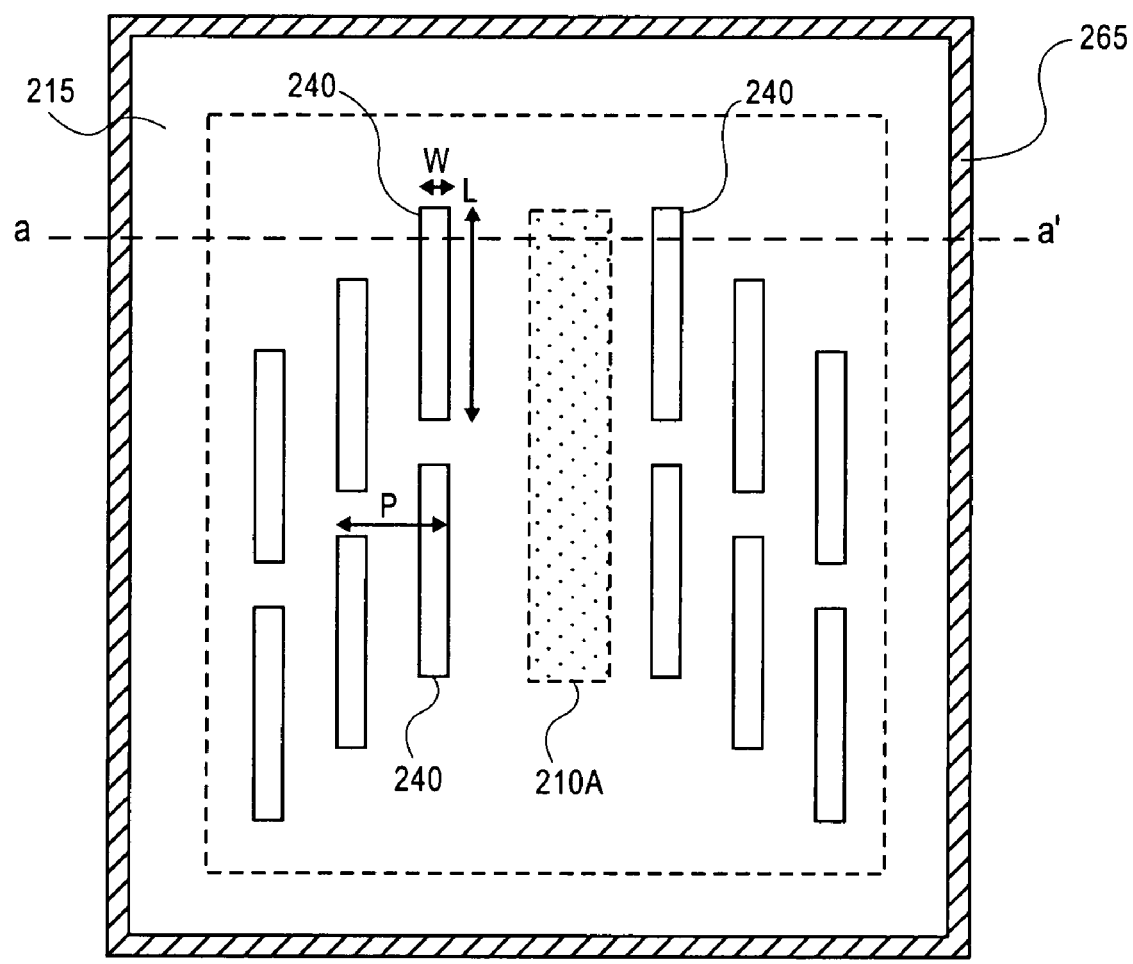

More specifically, a microshell in accordance with an embodiment of the present invention is depicted in FIG. 2A and FIG. 2B. FIG. 2A is depicts a cross-sectional view of the microshell taken along the a-a' dotted line shown in the plan view of the microshell in FIG. 2B. FIG. 2A is separated into three regions: an integrated circuit ("IC") region, a "MEMS" region and a "microshell" region. Each region is discussed in greater detail below. In the embodiment depicted, the "microshell" region comprises those layers within the bracket extending between, and including, conductive layer 265 forming the outer sidewall of the microshell.

The IC region includes metallization 203 and 204 and inter-layer dielectric (ILD) 202 formed over substrate 201. In the figure, these layers represent the structures typically found in a microelectronics IC. The IC may rely on any commonly known microelectronic transistor technology, such as, but not limited to MOSFET and bipolar junction transistors (BJT). It should be noted that while FIG. 2A depicts an embodiment integrating the microshell with an IC, such a high level of integration is not required. Therefore alternate embodiments may merely have a discrete MEMS or other device over substrate 201 and package with a microshell in accordance with the present invention.

Substrate 201 may be any commonly known semiconductor substrate, such as, but not limited to, single crystalline silicon, germanium or a silicon/germanium layer doped with an appropriate charge carrier. Substrate 201 may alternatively be comprised of a III-V material such as but not limited to gallium nitride, gallium phosphide, gallium arsenide, indium phosphide or indium antimonide. Moreover, substrate 201 may comprise an insulating layer such as silicon dioxide or silicon nitride embedded below a monocrystalline semiconductor layer to form, for example, a silicon on insulator or germanium on insulator substrate. Bulk insulators, such as sapphire, quartz, and glass may also be used.

As will be shown, microshells of the present invention are advantageously planar and comprise materials formed at a low temperature, so may be integrated into a common IC fabrication process at virtually any point in the back end of line (BEOL). As shown in FIG. 2, metallization 203 and 204 is on substrate 201, however in other embodiments, metallization 203 and 204 is of an intermediate level of interconnect metal in the IC (e.g. metal level three in a nine metal level BEOL IC process). In still another embodiment, metallization 203 and 204 is of an uppermost level of interconnect forming pad structures etc. that are typical of an IC (e.g. metal level nine in a nine metal level BEOL IC process). Metallization 203 and 204 may be comprised of any metal commonly employed in the microelectronics industry for BEOL interconnect, such as, but not limited to, copper, aluminum, tungsten, titanium, and combinations thereof. In the embodiment shown in FIG. 2, metallization 203 provides an electrical ground while metallization 204 electrically couples MEMS 210 to signal and power sources for driving and sensing MEMS 210. Metallization 204 may rout signal and power either to/from lower layers of interconnect or to/from a location external the microshell on the same metallization level (passing between regions of metallization 203).

Inter-layer dielectric (ILD) 202 is comprised of any dielectric commonly employed as BEOL insulator in the microelectronics industry, such as, but not limited to, oxides and nitrides of silicon and low-k dielectrics like fluorinated silica glasses, porous silicon dioxides and spin-on polymeric dielectrics.

The MEMS region depicted in FIG. 2A comprises a structural layer forming MEMS 210 and ground ring 215. MEMS 210 may include any micromechanical structure commonly known in the art. The particular MEMS shown is a MEMS resonator comprising a resonant member 210A separated from drive/sense electrodes 210B by a small gap (on the order of 100 nm, for example). In an embodiment, resonant member 210A is a beam to operate in a flexural resonant mode. The beam may be cantilevered or anchored at two ends, as is known in the art. Similarly, resonant member 210A may be in a tuning fork configuration or otherwise. In other embodiments, resonant member 210A is a plate or ring to operate in a bulk resonant mode. As shown, resonant member 210A is partially free of substrate 201 to allow mechanical motion relative to the substrate. Drive/sense electrodes 210B are electrically coupled to metallization 204. In the embodiment shown, ground ring 215 comprising the structural layer of MEMS 210 circumscribes MEMS 210. Ground ring 215 is electrically coupled to metallization 203.

The structural layer forming MEMS 210 and ground ring 215 is of a material of sufficient conductivity to serve as drive/sense electrodes 210B and ground ring 215. Because the embodiment shown is a resonator, the structural layer material must also endow resonant member 210A with good performance metrics, such as, but not limited to, a sufficiently high Q and a low, or at least predictable, temperature coefficient of frequency (TCF). In one particular embodiment, MEMS 210 and ground ring 215 comprise an alloy of silicon and germanium. In one such embodiment, the alloy composition is approximately 35% silicon and 65% germanium with a boron doping. In an alternate embodiment, MEMS 210 and ground ring 215 is formed of silicon.

The remaining structures depicted in FIG. 2A are the microshell package. As previously mentioned, microshells in accordance with embodiments of the present invention have structural features that combine synergistically to result in a highly planar package. Such high planarity enables these microshell to be integrated seamlessly anywhere in the BEOL of common microelectronic fabrication processes, provides flexibility in package size and lends itself to arrayed microshell arrangements. The microshell embodiment shown in FIG. 2A has: 1) chamber spacing layer 220; 2) a pre-sealing layer 230 including an integrated getter layer 230B; 3) a sealing layer 250 further including an occluding layer 250A and a hermetic layer 250B; 4) a conducting layer 265; and 5) a shell reinforcing layer 270.

Chamber spacing layer 220 is related to the formation of chamber 222 (described below) and is of a material which can be formed at a relatively low temperature, below approximately 500° C., to be compatible with common BEOL processes. In a particular embodiment, chamber spacing layer 220 is greater than 98% germanium atoms and boron dopant impurity atoms having a total atomic concentration in the range of $5 \times 10^{19}$-$5 \times 10^{20}$ atoms/cm$^3$. In an alternate embodiment, chamber spacing layer 220 further comprises an embedded etch stop layer comprising a distinct material, such as, but not limited to, a silicon germanium alloy.

Pre-sealing layer 230 extends over chamber 222 and along sidewall 227. Although the pre-sealing layer in the embodiment depicted includes a getter layer 230B integrated between pre-sealing layer 230A and pre-sealing layer 230C, it should be appreciated that in an alternate embodiment, getter layer 230B is absent and there is no structural distinction between pre-sealing layer 230A and pre-sealing layer 230B. In such an embodiment, pre-sealing layers 230A and 230C merge to form a homogeneous pre-sealing layer 230. Thus, for such an embodiment, the physical and structural properties of pre-sealing layer 230 are simply those described below for pre-sealing layer 230A.

Pre-sealing layer 230A forms sidewall 227 of sufficient thickness to isolate chamber 222 from chamber spacing layer 220. The thickness of pre-sealing layer 230A must also be sufficient to protect getter layer 230B from the etchant employed to subsequently form chamber 222 but thin enough that getter layer 230B may still capture contaminants from chamber 222. In particular embodiments, pre-sealing layer 230A is between 5 nm and 500 nm. Pre-sealing layer 230A may be any material capable of providing sufficient etch selectivity relative to the chamber spacing layer 220. In an embodiment, pre-sealing layer 230A is a hygroscopic material. In a particular embodiment, pre-sealing layer 230A comprises an oxide of silicon. Oxides of silicon, such as silicon dioxide ($SiO_2$), provide good selectivity to common etchants of germanium and therefore are is compatible with a germanium chamber spacing layer 220. In certain embodiments incorporating getter layer 230B, pre-sealing layer 230A is a permeable material to enhance the ability of getter layer 230B to getter contaminants from chamber 222. In one such embodiment pre-sealing layer 230A is a porous oxide of silicon. In an alternate embodiment, pre-sealing layer 230A is a fluorinated glass or other low-k material commonly used in the art.

On pre-sealing layer 230A is getter layer 230B. Getter layer 230B is configured to capture molecules, such as hydrogen, nitrogen, oxygen, water vapor, oxides of carbon, and methane from within chamber 222. These molecules are known to be present in chamber 222 prior to sealing or emitted over time into chamber 222 by the materials making up the microshell. Removal of these materials improves the microenvironment of chamber 222, which can effect the operation of MEMS 210. In this manner, the pressure within the microshell is stabilized over time to provide a more stable resonant member 210A. The thickness of getter layer 230B is related to the size of the microshell because the getter's capacity for removal is limited primarily by the volume (i.e. number of atoms) of getter material. In particular embodiments, getter layer 330B is between approximately 10 nm thick and approximately 100 nm thick. As shown in FIG. 2A, getter layer 230B is corrugated and extends upward adjacent to perforation 240. This corrugation of getter layer 230B advantageously increases the getter surface area with no increase in the surface area of substrate 201 occupied by chamber 222. The number of perforations 240 and the depth of perforation 240 may be predetermined to achieve an appropriately large getter surface area. As discussed in further detail below, in a particular embodiment, each perforation 240 has a high aspect ratio (large depth to diameter ratio). Because getter layer 230B surrounds each perforation 240 as a continuous film, a large increase in getter surface area is achieved for a given inner perimeter of microshell defined by sidewall 227. By forming getter layer 230B adjacent to each perforation 240, dummy structures containing getter material disposed within chamber 222 may be avoided. This can reduced the size of chamber 222 resulting in greater microshell strength and higher microshell packing density. The increased getter surface area translates into reduced mass loading of resonant member 210A and improved pressure control inside the microshell.

As further shown in FIG. 2A, because getter layer 230B is integrated into pre-sealing layer 230, getter layer 230B is positioned directly above resonant member 210A. This close proximity to resonant member 210A is important because deposition of contaminant molecules onto resonant member 210 can change the mass of resonant member 210 and detrimentally alter the resonant frequency. The closer the proximity of getter layer 230B to resonant member 210A, the more effectively the getter can scavenge contaminants away from resonant member 210A. Because the height of the chamber 222 may be less than the lateral dimension of sense/drive electrodes 210B, getter layer 230B may be more proximate to resonant member 210A than a getter merely disposed within chamber 222. In a particular embodiment, getter layer 230B is a distance from the resonant member 210A that is less than the mean free path defined by the pressure within chamber 222. Furthermore, the presence of getter layer 230B directly above resonant member 210A provides a getter surface above the entire length of resonant member 210A, which cannot be achieved for getter materials disposed within chamber 222 (e.g. adjacent to MEMS 210 or in a periphery of chamber 222) that frequently must accommodate electrodes adjacent to resonant member 210A.

Getter layer 230B, as integrated into pre-sealing layer 230 further provides a barrier of getter material across a significant portion of the top surface of chamber 222. Therefore, relative to getters disposed within the chamber, getter layer 230B has an enhanced ability to prevent contaminants originating externally from chamber 222 from entering chamber 222.

In the embodiment shown in FIG. 2A, getter layer 230B is electrically coupled to conductive layer 265, which extends down the outer sidewall of the microshell. Conductive layer 265 is further electrically coupled to ground ring 215. Therefore, in this embodiment, getter layer 230B is electrically coupled to an electrical ground. Getter layer 230B provides a ground reference potential near the inner surface of the microshell, in close proximity to a device disposed therein. This can be advantageous, for example, in electrically shielding a device within the chamber or capacitively coupling to a device within the chamber that is at another potential to form a capacitor or otherwise modulate a behavior of the device through capacitive coupling.

Getter layer 230B may be any getter material commonly known in the art capable of scavenging at least one of hydrogen, nitrogen, oxygen, water vapor, oxides of carbon, and methane and is compatible with BEOL processing. In one embodiment, getter layer 230B comprises titanium. In another embodiment, getter layer 230B comprises aluminum.

As shown, on getter layer 230B is pre-sealing layer 230C. Pre-sealing layer 230C provides a cap over getter layer 230B and increases the thickness of the pre-sealing layer to enable the method of perforating the pre-sealing layer described in detail below. Pre-sealing layer 230C may be any material compatible with low temperature BEOL IC processing, such as those materials previously described for pre-sealing layer 230A. In a particular embodiment, pre-sealing layer 230C comprises an oxide of silicon. Oxides of silicon, such as silicon dioxide ($SiO_2$), provide good selectivity to etchants of germanium and therefore are compatible with a germanium chamber spacing layer 220. In certain embodiments, pre-sealing layer 230C is a bi-layer comprised of at least two distinct materials. In one such embodiment, pre-sealing layer 230C comprises a first layer of silicon dioxide and a second layer of silicon nitride.

Pre-sealing layer 230C may be under either compressive (positive) or tensile (negative) stress, depending on the desired residual stress in the completed multi-layered microshell. Pre-sealing layer 230C has a greater thickness than pre-sealing layer 230A and so the stress of the pre-sealing layer 230 depends primarily on the stress of pre-sealing layer 230C. In one embodiment, a silicon dioxide pre-sealing layer 230C is under compressive stress with a magnitude of between 50 MPa and 300 MPa.

Pre-sealing layer 230 has an aperture, vent, or perforation 240. As discussed in more detail below, perforation 240 provides access to a portion of chamber spacing layer 220 that is removed to form chamber 222. As shown in FIG. 2, perforation 240 extends through the entire thickness of pre-sealing layer 230 above chamber 222. The depth of perforation 240 is determined by the thickness of pre-sealing layer 230A, getter layer 230B, and pre-sealing layer 230C.

Perforation 240 has a minimum dimension sufficiently large to allow etching of a sacrificial portion of chamber spacing layer 220, but not so large that sealing material is subsequently back-deposited on MEMS 210. In a particular embodiment, perforation 240 has a minimum dimension of between 0.4 um to 1 um. In another embodiment, perforation 240 has a minimum dimension of less than 0.5 um when metallization 204 and 203 are at least the third level of metal of a BEOL IC process. In still another embodiment, perforation 240 has a minimum dimension of less than 0.5 um printed in a mask layer subsequent to the bond pad mask of a BEOL IC process employing more than four layers of interconnect.

In an embodiment, as shown in the plan view of FIG. 2B, perforation 240 has a length dimension that is significantly greater than a width (i.e. a slot). Embodiments with a slot perforation are advantageous for multiple reasons. First, lithography constraints are relaxed when one dimension is significantly greater than the other because astigmatism becomes less of an issue and focus of the minimum dimension (width) becomes easier. Thus, the minimum dimension of a slot or blade can be made smaller than the minimum dimension of a square hole or opening. Furthermore, the greater length dimension of a slot perforation can improve wetting of the etchant used to form chamber 222 relative to a square hole of equal length and width. In the particular embodiment shown in FIG. 2B, the length dimension of slot perforation 240 is parallel to and offset laterally from, resonant member 210A. In this manner, back-deposition of sealing material onto resonant member 210A is kept to a minimum since the solid angle from above perforation 240 is anisotropic and most limited in the direction toward resonant member 210A. In other words, the minimal width of perforation 240 shadows the offset resonant member 210A from deposition species during subsequent deposition of the sealing layer. Thus, the laterally offset slot perforation embodiment shown in FIG. 2B provides wet etchants better access to chamber 222 without negatively increasing back-deposition of sealing material on resonant member 210A when perforation 240 is subsequently sealed.

The aspect ratio of perforation 240 is important for many reasons. Herein, the aspect ratio refers to a ratio of the height (i.e. depth) of perforation 240 over the minimum diameter of perforation 240. For example, a perforation in the form of a rectangular slot with a width dimension of 0.5 um and a length dimension of 1 um formed through a pre-sealing layer having a height (i.e. thickness) of 2 um has an aspect ratio of 0.5:2 or 4:1. For perforations with a sloped sidewall, the aspect ratio is based on the dimension of the top surface of pre-sealing layer 230 (i.e. "top CD"). The physical strength of the pre-sealing layer generally correlates with the aspect ratio of perforation 240. For example, greater aspect ratios typically weaken the pre-sealing layer 230 to a lesser extent than smaller aspect ratios. Additionally, the aspect ratio of perforation 240 affects the transport of etchant species and byproducts when chamber spacing layer 220 is removed to form chamber 222. For example, greater aspect ratios generally reduce etchant transport and such perforations can have poor wetability when etchants with relatively high surface tension (e.g. wet chemicals) are employed. Moreover, the aspect ratio of perforation 240 impacts what materials and techniques may be used to close perforation 240 with a sealing layer. For example, higher aspect ratios reduce back-deposition of sealing layer material on the interior surfaces of chamber 222 and on MEMS 210. All of these factors must be considered for optimal microshell design. In certain embodiments, the aspect ratio of perforation 240 is between 1:1 and 4:1. In a particular embodiment, perforation 240 has an aspect ratio of approximately 3:1. In a high aspect ratio embodiment, the aspect ratio is at least 8:1 to greatly reduce the likelihood of back-deposition of sealing material on the inner surfaces of chamber 222.

The sidewall angle of perforation 240 is also important because this angle can impact back-deposition of sealing material. In one embodiment, perforation 240 has a negative etch profile, meaning the sidewall of perforation 240 is re-entrant such that the aperture dimension is larger at the bottom than at the top. For such an embodiment, back-deposition of sealing material onto the inner surface of chamber 222 and MEMS 210 is reduced because the geometry of perforation 240 results in decreased material deposition on the sidewalls of perforation 240.

The location of perforation 240 affects the strength of the microshell, the transport of etchant species to/from chamber 222 and the back-deposition of sealing material. As shown in FIG. 2, perforation 240 is above chamber 222. Perforations above the chamber give etchants better access to the chamber relative to perforations made into a sidewall of the chamber. In a further embodiment, as shown in cross-sectional view in FIG. 2A or plan view in FIG. 2B, perforation 240 is horizontally offset from resonant member 210A to increase shadowing of resonant member 210A from deposition species. Relative to a perforation positioned directly over a resonant member, this offset reduces back-deposition of sealing material when the perforation is subsequently sealed. Thus, in such an embodiment, access to chamber 222 is improved while back-deposition of material on to resonant member 210A is reduced.

As further shown in FIG. 2B, perforation 240 may be replicated to form a plurality of perforations in one microshell. The plurality improves access to chamber 222, reducing time required to form chamber 222. The pitch, P, of perforation 240 is dependant on the lateral etchrate of chamber spacing layer 220 and may be anywhere between 1 um and 10 um. In a particular embodiment, two adjacent perforations are offset from one another in at least one dimension to form the staggered perforation pattern depicted in FIG. 2B. Embodiments with staggered perforations provide isotropic deflection of the microshell. Isotropic deflection, among other things, improves overall strength of the microshell by uniformly distributing stresses placed on the microshell.

A sealing layer 250, incorporating occluding layer 250A and hermetic layer 250B, is further shown in FIG. 2A. Sealing layer 250 is on pre-sealing layer 230 to close perforation 240 and thereby completely enclose chamber 222. Occluding layer 250A at least partially occludes perforation 240 and prevents subsequently deposited films from entering chamber 222. Occluding layer 250A deposits on a portion of the sidewall of perforation 240 depending on the aspect ratio of perforation 240 and the deposition process. Ideally, occluding layer 250A closes the top surface of perforation 240 with minimal deposition material accumulating on the sidewalls of perforation 240 proximate to chamber 222. In a particular embodiment, as shown in FIG. 2A, occluding layer 250A is non-conformal. Here, the term "non-conformal" describes the structural characteristic of a film having a thickness on a top surface greater than the thickness on a sidewall that is non-parallel to the top surface.

Occluding layer 250A can be any commonly known film compatible with low temperature BEOL IC fabrication that is capable of at least partially occluding perforation 240 with minimal back-deposition onto inner surfaces of chamber 222 and MEMS 210. In one embodiment, occluding layer 250A is non-hermetic. A non-hermetic occluding layer decouples occluding of perforation 240 from hermetically sealing the chamber to provide greater fabrication flexibility, as discussed in further detail below. In one such embodiment, occluding layer 250A is a dielectric, such as silicon dioxide. In other embodiments, occluding layer 250A is a silicon-oxynitride (SiON) or a silicon nitride (SiN). Occluding layer 250A may be under either compressive (positive) or tensile (negative) stress, depending on the desired residual stress in the completed microshell. In one embodiment employing a silicon dioxide, occluding layer 250A is under compressive stress with a magnitude of between 50 MPa and 300 MPa.

Extending over occluding layer 250A is hermetic layer 250B. Hermetic layer 250B hermetically seals chamber 222. Hermetic layer 250B may be comprised of any material commonly known capable of providing hermeticity and is also compatible with low temperature BEOL IC processing. Hermeticity, as used herein, describes a leak rate that is on the order of years rather than a few hours or days (as may be case for occluding layer 250A). In a particular embodiment, hermetic layer 250B has a leak rate below $5 \times 10^{-12}$ STD cm$^3$/sec. In one embodiment, the hermetic layer comprises a metal, such as, but not limited to, tungsten, copper, titanium, and their alloys. In a particular embodiment, hermetic layer 250B includes aluminum. As is commonly done in the art, the aluminum may be alloyed with another metal such as, but not limited to, copper. In a further embodiment, layer 250B is of an uppermost level of interconnect forming pad structures and/or edge seals, etc. that are typical of an IC (for example metal level nine of a nine level metal BEOL IC process).

In a further embodiment, hermetic layer 250B is under tensile stress to increase the strength of the microshell. In one such embodiment, an aluminum hermetic layer 250B is under a tensile stress having a magnitude slightly greater than the magnitude of compressive stress in the pre-sealing layer 230 and occluding layer 250A to lower the magnitude of the residual stress in the microshell. In one embodiment employing a silicon dioxide, hermetic layer 250B is under tensile stress with a magnitude of between 100 MPa and 500 MPa with a thickness sufficient to produce a tensile residual stress in the microshell between 50 and 100 MPa.

In the embodiment shown in FIG. 2A, hermetic layer 250B is coupled to a conductive layer 265 extending down the outer sidewall of the microshell. As shown, conductive layer 265 is further electrically coupled to ground ring 215. Therefore, hermetic layer 250B is electrically coupled to an electrical ground potential, thereby electrically grounding the microshell. In this embodiment, hermetic layer 250B provides a ground reference potential in close proximity to the MEMS 210 disposed therein. This can be advantageous, for example, in electrically shielding MEMS 210 within the chamber or capacitively coupling to a device within the chamber that is at another potential to form a capacitor.

Conductive layer 265 may be any material commonly known capable of providing a relatively low resistance and is compatible with low temperature BEOL IC processing. Generally, conductive layer 265 need not carry a significant current, so it is not necessary to minimize the resistivity of the layer. In one embodiment, conductive layer 265 is a metal, such as, but not limited to, tungsten, copper, titanium, and their alloys. In a particular embodiment, conductive layer 265 includes aluminum. As is commonly done in the art, the aluminum may be alloyed with another metal such as, but not limited to, copper.

Finally, in the embodiment shown in FIG. 2A, a shell reinforcing layer 270 comprising a semiconductor material is on hermetic layer 250B to form a semiconductor-metal-insulator microshell. This semiconductor layer reinforces the microshell via diffusion of the semiconductor material into the hermetic layer 250B. Shell reinforcing layer 270 may be comprised of any semiconductor material commonly known in the art to be compatible with low temperature BEOL IC processes (i.e. formed below 500° C.). In a particular embodiment, the semiconductor material is an alloy of silicon and germanium. In one such embodiment incorporating an aluminum hermetic layer 260, the silicon germanium alloy forms a germanosilicide compound at the interface of the aluminum hermetic layer.

Figure 3E:
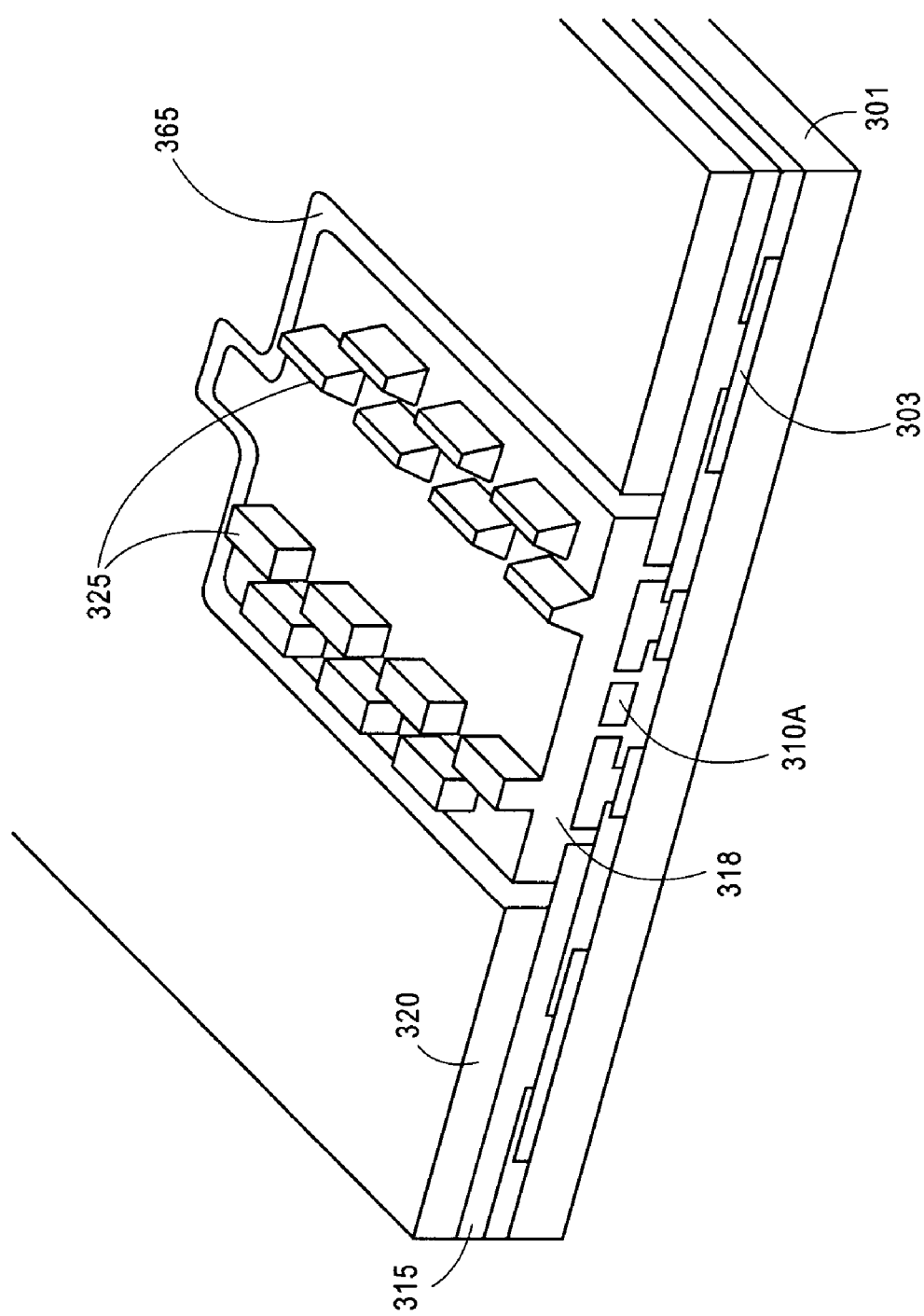
FIG. 3E is a perspective view of the microshell depicted in the cross-section view of FIG. 3D.

FIGS. 3A-3L depict a damascene method of fabricating a microshell in accordance with the present invention. The method begins with the MEMS and IC portion substantially completed, as shown in FIG. 3A. The MEMS and IC portions are completed using commonly known techniques, such as, but not limited to chemical vapor deposition (CVD), physical vapor deposition (PVD), electroplating, chemical mechanical planarization (CMP), patterned and unpatterned etching by wet chemicals or by reactive ion etching (RIE) plasmas. As microshell fabrication in accordance with the present invention may be employed for a variety of MEMS and microelectronics devices, it should be appreciated that the formation of the MEMS and IC portion may vary substantially and therefore the starting material of the present method may deviate significantly from that depicted in FIG. 3A. Nonetheless, one of ordinary skill in the art will understand how to apply the present method taught in the context of the specific starting material shown in FIG. 3A.

Generally, formation of the IC portion includes the deposition of ILD 302 by CVD and deposition of metallizations 303 and 304 by PVD or electroplating over substrate 301. Metallizations 303 and 304 may be patterned lithographically and subsequently etched or metallizations 303 and 304 may deposited in pre-formed trenches in ILD 302 and subsequently delineated with CMP as in a common damascene metal interconnect process.

As an exemplary implementation, a MEMS structural layer is then formed over the IC portion using a damascene process that is more thoroughly described in the nonprovisional patent application entitled "Damascene Process for Use in Fabricating Semiconductor Structures Having Micro/Nano Gaps," which was filed on May 3, 2005 and assigned Ser. No. 11/121,690. In general terms, release layer 317 is deposited, planarized, and etched with a pattern to form blades or posts.

In a particular embodiment, release layer 317 is germanium deposited at a temperature of approximately 350° C. using a low pressure (LP) CVD process. Following the formation of release layer 317, a MEMS structural layer is then deposited over release layer 317 and planarized to expose the blades or posts of release layer 317 and thereby separate the structural layer into a resonant member 310A, sense/drive electrodes 310B and ground ring 315. In a particular embodiment employing a germanium release layer 317, MEMS structural layer forming resonant member 310A, sense/drive electrodes 310B and ground ring 315 is an alloy of silicon and germanium deposited at a temperature of approximately 425° C. using an LPCVD process. A chemical-mechanical planarization operation commonly known in the art is employed to planarize the structural layer and expose portions of release layer 317. MEMS 310 remains embedded in release layer 317 to avoid exposing a fragile released MEMS to the subsequent microshell fabrication. After fabricating the starting material as depicted in FIG. 3A, the damascene microshell fabrication process then forms a highly planarized microshell structure which can be incorporated at virtually any BEOL level of the typical IC fabrication process.

As shown in FIG. 3B, microshell fabrication begins with formation of a chamber spacing layer 320 covering MEMS 310, release layer 317 and ground ring 315. Formation of chamber spacing layer 320 may be by any growth or deposition process that is compatible with a low-temperature BEOL IC process. Chamber spacing layer 320 may be formed from any of the materials described in reference to layer 220 in FIG. 2A. In the embodiment depicted, an in-situ boron doped polycrystalline germanium film is deposited by LPCVD at a temperature of approximately 350° C. Thus, the germanium chamber spacing layer 320 joins release layer 317 to form a continuous material of homogeneous composition.

Chamber spacing layer 320 is grown to a thickness required for the final chamber height which is a function of the device disposed therein. The thickness of chamber spacing layer 320 is sufficient to provide a chamber with a height required for a particular MEMS 310. For example, in an embodiment employing a resonant member, chamber spacing layer 320 is thicker for low frequency resonator than for a high frequency resonator. In other embodiments, other surface area to chamber volume constraints may dictate the thickness of chamber spacing layer 320. Generally, chamber volume is also a function of the amount of sag the microshell will undergo during a subsequent pressure bonding operation in a final package process. The amount of sag is related to the physical span of the microshell and magnitude of the pressure differential between the interior of the microshell and exterior ambient. In the embodiment depicted, for example, chamber spacing layer 320 is grown to 4 um. In further embodiments, an etch stop layer (not shown) may also be formed in chamber spacing layer 320. In one such implementation, an etch stop layer of silicon germanium alloy is included in a germanium chamber spacing layer.

Next, as shown in FIG. 3C, the outer edge of the chamber, or equivalently, the inner wall of the microshell, is defined with a first patterned etch of chamber spacing layer 320 to form trench 321. Trench 321 is the first mold for the damascene microshell. Patterning of trench 321 (not shown) may be by various lithographic techniques including, but not limited to, lithographic patterning of a resist mask photosensitive I-line, ultraviolet (UV), deep UV (DUV) or e-beam radiation. Trench 321 is patterned to form a slot or trench to define the location of the inner wall of the microshell. Trench 321 is therefore patterned to circumscribe MEMS 310.

As shown, trench 321 is etched to a depth less than the thickness of chamber spacing layer 320. Trench 321 is etched to a depth approximately equal to the total thickness of chamber spacing layer 320 minus the desired final height of the chamber, as discussed in further detail below. For example, for a chamber spacing layer of 4 um, trench 321 has a depth of approximately 2 um. For embodiments where an etch stop layer is incorporated, the etching of trench 321 may be terminated on the stop layer. The stop layer may then be retained or removed with an appropriate etch chemistry, as commonly known in the art. In a particular embodiment, the width, W, of trench 321 has a significantly smaller dimension than the depth, providing an aspect ratio greater than 2:1 (depth: width). The higher aspect ratio of trench 321 ultimately improves planarity of the microshell because a higher aspect ratio trench 321 is more easily filled by a subsequently deposited pre-sealing layer.

In general, any method of etching chamber spacing layer 320 having adequate etch rate control and critical dimension control may be employed. The etch chemistry and technique employed depends on the composition of chamber spacing layer. Both wet etch techniques and dry etch techniques may be employed. In an embodiment incorporating a chamber spacing layer 320 of germanium, the dry etch process comprises an anisotropic plasma etch process wherein the plasma is generated from at least one gas selected from the group consisting of sulfur hexafluoride ($SF_6$), carbon tetrafluoride ($CF_4$), hydrogen bromide (HBr), chlorine ($Cl_2$), and oxygen ($O_2$). Alternatively, a wet etch process may be employed. For example, for a chamber spacing layer 320 of germanium, the wet etch comprises an aqueous solution of $H_2O_2$ with a concentration in the range of 25-35% by volume at a temperature in the range of 80° C.-95° C.

Next, as shown in FIG. 3D, chamber spacing layer 320 is patterned to form a non-planar sacrificial layer 318 having a blade 325. Blade 325 is a mandrel for the damascene microshell. During this patterning operation, trench 321 is further etched to expose ground ring 315 and thereby physically isolate sacrificial layer 318 from chamber spacing layer 320. Thus, the successive patterning of trench 321 and blade 325 combine for a dual-damascene microshell process. Concurrently with the etching of trench 321, sacrificial layer 318 is etched to form blade 325. The mask pattern protects a full thickness of sacrificial layer 318 only where blade 325 is formed. Sacrificial layer 318 is selectively non-planarized, or de-planarized because the non-planarity in sacrificial layer 318 is a result of the blade patterning. Similarly, in the embodiment shown, the chamber spacing layer 320 is also etched at this time to retain planarity with etched portions of sacrificial layer 318.

The etch process employed for this second damascene molding etch, or blade etch, may be the same as that employed in the first etch forming trench 321. For example, the second etch may be performed with a dry etch process. In an embodiment incorporating a sacrificial layer 318 of germanium, the dry etch process comprises an anisotropic plasma etch process wherein the plasma is generated from at least one gas selected from the group consisting of $SF_6$, $CF_4$, HBr, $Cl_2$ and $O_2$. Alternatively, a wet etch process may be employed. In an embodiment incorporating a sacrificial layer 318 of germanium, the wet etch comprises an aqueous solution of $H_2O_2$ with a concentration in the range of 25-35% by volume at a temperature in the range of 80° C.-95° C.

Because blade 325 ultimately defines a perforation in a subsequently deposited pre-sealing layer, the blade aspect ratio and geometry has a significant impact on both the etching of sacrificial layer 318 and back-deposition of material during subsequent sealing of the microshell (as previously discussed in reference to perforation 240 of FIG. 2). The dual damascene microshell benefits from the ability to form a blade 325 that can be narrower and/or taller than a via directly etched into a subsequently deposited pre-sealing layer.

The minimum dimension of blade 325 may be made smaller than it would be possible to directly pattern apertures because line patterning technology commonly employs a dry develop (e.g. resist ashing) process which can trim the resist mask line to a sublithographic dimension (a dimension below the practical printable limit for an arbitrary exposure wavelength). The sublithographic mask can then be etched into sublithographic blade 325. In contrast, lithographically printed spaces can only be made larger by such processes and so vias etched into a subsequently deposited pre-sealing layer are limited to the minimum printable limit for a given level of non-planarity in the substrate. Thus, in a particular embodiment, resist blades having a minimum dimension within manufacturing capabilities are first printed into a photosensitive resist mask, the resist blades are then dry developed to produce a resist blade having a smaller dimension than as printed, sacrificial layer 318 is then etched to form blade 325 having a minimum dimension between 0.4 um and 1 um. In an alternate embodiment, blade 325 is patterned (masked and etched) to have a minimum dimension less than 0.3 um at a photo mask level subsequent to a third metallization level in a BEOL IC process. The length dimension of blade 325 (into the pane of FIG. 3E) may be significantly larger than the width dimension, W, as the term "blade" typically encompasses. However, it should be appreciated that a post having roughly equal length and width dimensions is within the scope of the present invention.

Similarly, the height of blade 325 is limited only by the fragility of the line and not by transport of etchant to the material interface as is the case for etching of an aperture. For example, etch stop becomes problematic even for ultra low pressure plasma etch processes when via depth exceeds approximately 8 times the width of the via (aspect ratio of 8:1). Thus, in a particular embodiment, blade 325 has an aspect ratio greater than 8:1. To further illustrate, in a particular embodiment having a chamber spacing layer 320 of 4 um and a minimum blade dimension of 0.4 um, sacrificial layer 318 is etched to form a blade 325 having a height greater than 3.2 um, leaving approximately 0.8 um of sacrificial layer 318 above resonant member 310A. In another embodiment, blade 325 is patterned to have a minimum dimension of 0.4 um and a depth of approximately 2 um for an aspect ratio of 5:1.

In a further embodiment also depicted in FIG. 3D, blade 325 is etched to have a positively sloped profile. As will be shown, the positively sloped blade profile will result in a negatively sloped perforation in the subsequently deposited pre-sealing layer. As previously discussed in reference to FIG. 2A, such a slope advantageously decreases the amount of back-deposition of sealing material onto resonant member 310A. In one such embodiment, sacrificial layer 318 is isotropicly etched to form a positively sloped blade 325 having a smaller top dimension that bottom dimension. In an alternate embodiment, a polymerizing plasma chemistry is used to etch sacrificial layer 318 resulting in a bottom blade dimension that is larger than the top blade dimension. In yet another embodiment, the masking material is first sloped, for example through a resist reflow, and an anisotropic etch translates the positively sloped mask into sacrificial layer 318. In still another embodiment, blade 325 is sputter etched to slope at least a portion of blade 325 to approximately 45 degrees.

As shown in FIG. 3D, blade 325 is patterned to be horizontally offset from resonant member 310A. In other words, blade 325 is not positioned directly above resonant member 310A. Rather, blade 325 is positioned on either side of resonant member 310A leaving a region of sacrificial layer 318 that has been thinned by a single etch process directly over resonant member 310A. Ultimately, it is the thickness of sacrificial layer 318 above resonant member 310A that defines the final height of the chamber within the microshell. For certain embodiments where the chamber height (i.e. spacing between the microshell and resonant member 310A) and/or height of blade 325 is particularly important, an etch stop layer (not shown) is incorporated into chamber spacing layer 320 to form a sacrificial layer 318 having a tightly control post-etch thickness. In such an embodiment, the second etch defining blade 325 is terminated on the etch stop layer (e.g. silicon germanium alloy layer).

FIG. 3E depicts a perspective view of the structures shown in cross-section in FIG. 3D. As shown in FIG. 3E, trench 321 defines a perimeter around the non-planar sacrificial layer 318 over resonant member 310A and sense/drive electrodes 310B. In the embodiment shown, blade patterning forms a plurality of blades in sacrificial layer 318 having a staggered or crenulated arrangement. The spacing between individual blades in a row is therefore staggered from a spacing between individual blades in an adjacent row. This staggered blade pattern isotropicly distributes stresses in the subsequently deposited pre-sealing and sealing layers. Thus, the staggered blade pattern results in a stronger microshell because any stress placed on the microshell, for example by a pressure differential, will cause the microshell is sag isotropicly, avoiding high strain points that fail prematurely. In a further embodiment, dummy blade structures are also formed in the periphery over chamber spacing layer 320 to improve planarity during subsequent processing, as further discussed below.

Figure 3F:
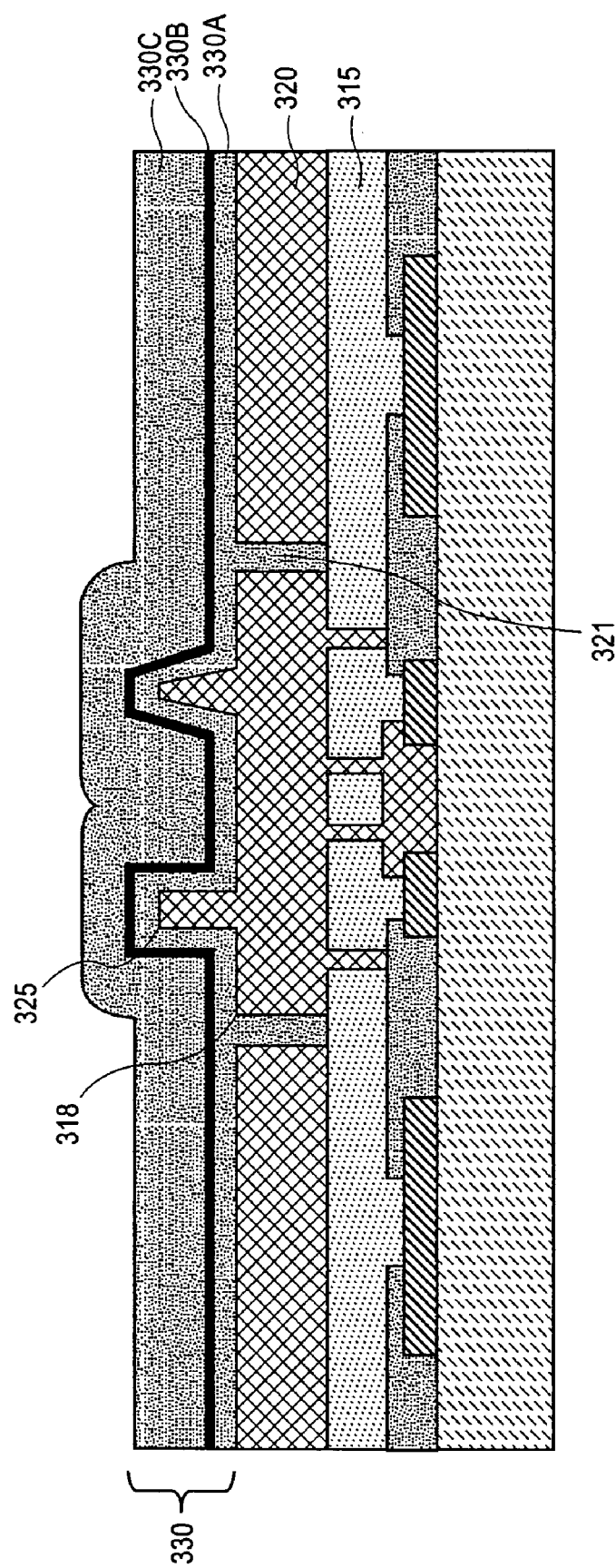

As shown in FIG. 3F, after the formation of blade 325, pre-sealing layer 330 is formed over the non-planar sacrificial layer 318 and chamber spacing layer 320. Generally, pre-sealing layer 330 is deposited to a thickness greater than the thickness of blade 325. In the embodiment shown, pre-sealing layer 330 is formed by successively depositing pre-sealing layer 330A, getter layer 330B, and pre-sealing layer 330C. As shown, pre-sealing layer 330A is deposited conformally to fill trench 321 and isolate sacrificial layer 318 from chamber spacing layer 320 with a low temperature process compatible with BEOL IC fabrication. In a particular embodiment, silicon dioxide is deposited using a tetraethylorthosilane (TEOS) based PECVD process at a temperature between 350° C. and 400° C. Getter layer 330B is then formed on pre-sealing layer 330A. Generally, any of the materials described in reference to getter layer 230B in FIG. 2A may be deposited. In a particular embodiment, a metal, such as titanium is deposited by a physical vapor deposition (PVD) deposition process.

Finally, pre-sealing layer 330C is formed on getter layer 330B. In a particular embodiment, silicon dioxide is deposited using a tetraethylorthosilane (TEOS) based PECVD process at a temperature between 350° C. and 400° C. In another embodiment, a bi-layer of silicon dioxide and silicon nitride is deposited using a PECVD process at a temperature between 350° C. and 400° C. Pre-sealing layer 330C is deposited to a thickness to augment the thickness of pre-sealing layer 330A and getter layer 330B so that the total thickness of pre-sealing layer 330 is greater than the thickness of blade 325. In one embodiment, a low stress PECVD process is employed to minimize the compressive stress of pre-sealing layer. In a further embodiment a rapid thermal anneal (RTA) of a few seconds in duration is subsequently performed to lower the stress of pre-sealing layer 330C to approximately 30 MPa.

Next, as shown in FIG. 3G, pre-sealing layer 330 is etched back and planarized by chemical mechanical polishing (CMP) to expose blade 325 and thereby perforate pre-sealing layer 330. The planarization process of FIG. 3G completes the dual-damascene aspect of the microshell fabrication. In a particular embodiment incorporating a silicon dioxide pre-sealing layer 330C, a commonly-known silicon dioxide CMP process is performed. Depending on the thickness of getter layer 330B, a distinct CMP process tuned for the getter material may be performed followed by a polish of pre-sealing layer 330A to expose blade 325. In further embodiments, dummy blade structures (not shown) formed in the periphery over chamber spacing layer 320 are also exposed to reduce dishing phenomena common in planarization processes. As shown, exposure of blade 325 provides a means to selectively remove sacrificial layer 318, as wells as MEMS release layer 317.

Next, as shown in FIG. 3H, blade 325 and sacrificial layer 318 are removed leaving perforation 340 and chamber 322, respectively. In a particular embodiment, MEMS release layer 317 is also removed at this operation to release resonant member 310A. Alternatively MEMS release layer 317 may be subsequently removed. Thus, resonant member 310A is not rendered fragile until after the protective chamber 322 has formed around the resonant member. Generally, the etch of sacrificial layer 318 must remove sacrificial layer 318 preferentially over pre-sealing layer 330A and any device structures, such as resonant member 310A. Because of radical geometries, the etch process must also be isotropic. In an embodiment incorporating a MEMS release layer 317 of germanium and a sacrificial layer 318 of germanium, a resonant member 310 of silicon germanium alloy and pre-sealing layer 330A of silicon dioxide, the etch is a wet chemistry, such as one comprising an aqueous solution of $H_2O_2$ with a concentration in the range of 25-35% by volume at a temperature in the range of 80° C.-95° C. As previously discussed in reference to FIG. 2B, the slot-shaped perforation 340 provides wet etchants good access to chamber 222. Alternatively, an isotropic plasma etch process wherein the plasma is generated from at least one gas selected from the group consisting of $SF_6$, $CF_4$, HBr, $Cl_2$, $O_2$, may be performed.

Then, as shown in FIG. 3I-FIG. 3J, chamber 322 is enclosed by closing perforation 340 with a sealing layer deposited on pre-sealing layer 330. Referring to FIG. 3I, occluding layer 350A is deposited on pre-sealing layer 330 with a non-conformal process that deposits material having a low surface mobility to at least partially occlude perforation 340. The occluding layer 350A is nonhermetic and may be comprised of any materials previously described in reference to occluding layer 250A of FIG. 2A. In a particular embodiment, prior to depositing occluding layer 350A, the substrate is in-situ baked for at least 30 seconds in the deposition chamber at approximately 400° C. to desorb contaminants from the interior of chamber 322. Such contaminants may have been left behind from the etch of the sacrificial layer 318 and release layer 317, or left behind by a rinsing/drying operation. Following the in-situ pre-bake, perforation 340 is then occluded with a dielectric deposited by a non-conformal process. The non-conformal dielectric deposition forms very little dielectric on underlying structures as the top edge of perforation 340 occludes. In one dielectric deposition embodiment, compressively stressed silicon dioxide is deposited with a silane ($SiH_4$) based PECVD process at a temperature below 400° C. In a further embodiment, the dielectric is deposited with the substrate tilted by a small angle relative to the predominant material flux within the deposition chamber to reduce back-deposition of the dielectric. The substrate tilt effectively decreases the solid angle of perforation 340 and because the deposition is non-conformal, perforation 340 occludes with relatively less sealing material entering chamber 322.

Once perforation 340 is at least partially occluded, hermetic layer 350B is deposited to seal chamber 322, as shown in FIG. 3J. Deposition of hermetic layer 350B is performed in quick succession with the deposition of occluding layer 350A because the nonhermetic occluding layer 350A is permeable and will allow ingassing/outgassing of chamber 322 over time when a pressure differential exists between chamber 322 and ambient. In a particular embodiment, prior to depositing hermetic layer 350B, the substrate is in-situ baked for at least 30 seconds in the deposition chamber at approximately 400° C. to desorb contaminants from the interior of chamber 322. Because occluding layer 350A is permeable (nonhermetic), outgassing of chamber 322 can occur during this pre-bake of seconds to hours.

As one of ordinary skill in the art will appreciate, deposition processes generally produce films having a certain amount of stress. For example, a PECVD processes frequently render films under compressive stress while PVD sputter processes frequently provide films under tensile stress. Often, the magnitude of a deposited film's stress is constrained by another deposition variable that must be optimized. For example, a requirement of a low temperature PECVD film may tend to result in a film with comparatively high compressive stress. Such process constraints can lead to undesirable levels of residual stress in the microshell. The multi-layered nature of microshells in accordance with the present invention provides an additional degree of freedom for stress tuning because the residual stress of the microshell may be controlled via a plurality of deposition methods. For example, a first stress in pre-sealing layer 330 formed by a first deposition method may be countered through use of a second deposition method to form sealing layer 350 with a second stress opposing the first stress. In one such embodiment, a PVD sputtering process is used to form a tensilely stressed aluminum hermetic layer 350B to counter the compressive stress in pre-sealing layer 330 formed by a PECVD process. In another embodiment, the process parameters of both the PECVD and PVD deposition recipes are adjusted as known in the art to form pre-sealing and sealing layers, respectively, having opposing stresses of approximately the same magnitude to reduce the magnitude of residual stress of the multi-layer microshell to below 200 MPa. In a further embodiment, the process parameters of both the PECVD and PVD deposition recipes are adjusted as known in the art to produce oppositely stressed pre-sealing and sealing layers to impart a tensile residual stress of between 50 MPa and 200 MPa in the multi-layer microshell.

As previously stated in reference to hermetic layer 250B of FIG. 2, decoupling the physical occlusion of perforation 340 from the hermetic sealing process allows greater fabrication flexibility. For example, in an embodiment incorporating a dielectric occluding layer and a metallic hermetic layer, the two distinct processes provide a very wide range over which the vacuum level within chamber 322 may be fixed. For example, common oxide deposition process pressures range from thousandths of Torr (mT) to multiple Torr, while typical metal PVD sputtering processes are generally below 10 mT. Thus, perforation 340 may be completely closed during either of these processes to set the vacuum level of chamber 322 from a few mT to multiple Torr, as required by the particular device disposed within the microshell. In an exemplary embodiment, perforation 340 is partially occluded to reduce the size of a perforation having a first dimension required for the etching of sacrificial layer 318 by depositing a PECVD oxide. Then, the partially occluded perforation is completely occluded and sealed by an aluminum hermetic layer 350B deposited at approximately 6 mT to seal chamber 322 at 6 mT. Similarly, because two distinct processes are employed and occluding layer 350A is nonhermetic, chamber 322 may be allowed to leak up to a predetermined pressure following deposition of occluding layer 350A. Because the leak rate may be on the order of seconds, hours, or days, a chamber 322 may reach a high ambient pressure before hermetic layer 350B is deposited.

Figure 3K:
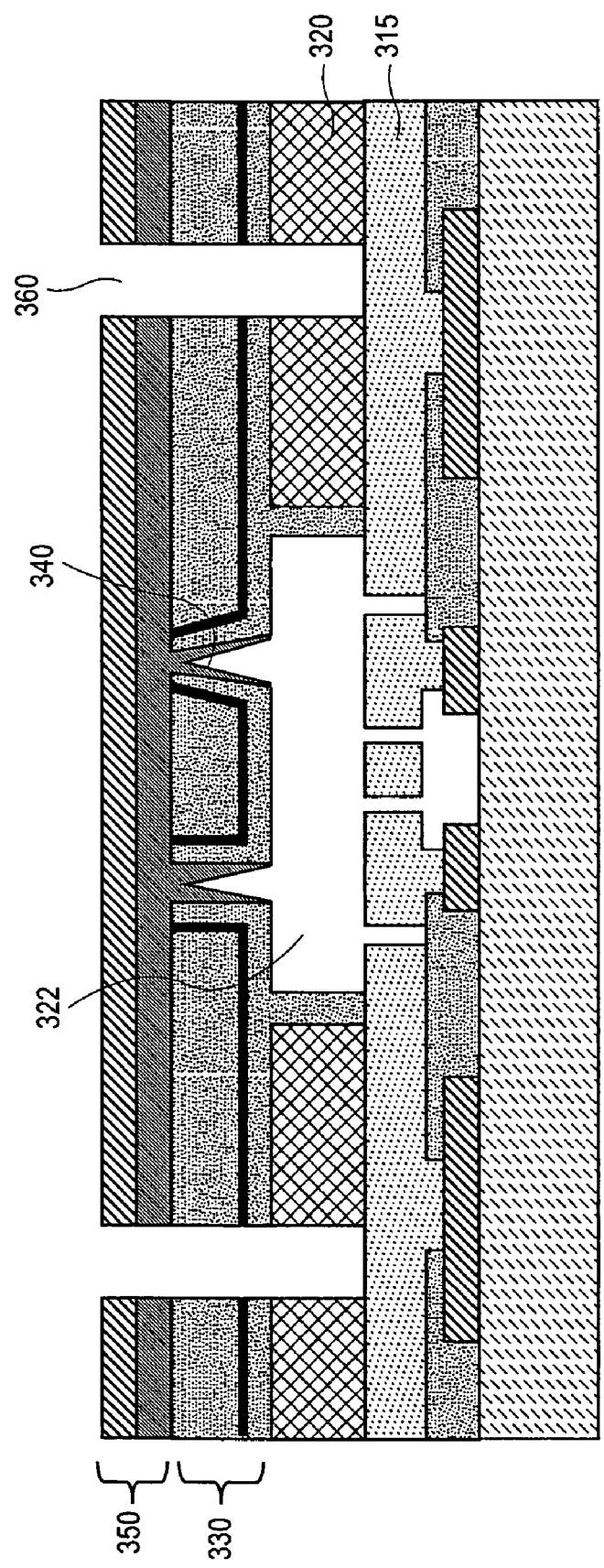

Continuing with fabrication of the microshell, as shown in FIG. 3J, a substantially planar multi-layer metal-insulator microshell has been formed. Next, as shown in FIG. 3K, via 360 is formed through sealing layer 350, pre-sealing layer 330 and chamber spacing layer 320 to expose ground ring 315. Via 360 forms a perimeter around the microshell and delineates the outer sidewall of the microshell. Etching the multi-layer metal-insulator microshell to form via 360 can be performed by successive wet or dry etches, as previously discussed in reference to each individual layer or by other techniques commonly known in the art. In a particular embodiment incorporating an aluminum and silicon dioxide sealing layer 350, a titanium and oxide pre-sealing layer 330, a buffered hydrofluoric acid solution, such as 5:1 buffered oxide etch (BOE), is used to expose chamber spacing layer 320. In embodiments incorporating a germanium chamber spacing layer, a germanium dry etch is then performed. Alternatively, a multi-step dry etch employing commonly known plasma chemistries may be employed to etch each layer comprising the microshell.

With the microshell outer surface completely delineated, conductive layer 365 is deposited on hermetic layer 350B to hermetically seal the microshell sidewalls and electrically couple the microshell to ground ring 315. Conductive layer 365 may be any material previously described in reference to conductive layer 265 of FIG. 2A. In a particular embodiment, a tensilely stressed aluminum is deposited by a PVD sputter process. In a further embodiment, the deposition process is tuned to impart a tensile stress in conductive layer 365 to lower the residual stress in the microshell below the magnitude of cumulative stress present in sealing layer 350 and pre-sealing layer 330. In another embodiment, the sputter deposition process is tuned to impart a tensile stress in conductive layer 365 sufficient to impart a tensile residual stress in the multi-layer microshell and increase the overall strength of the microshell.

Figure 3L:
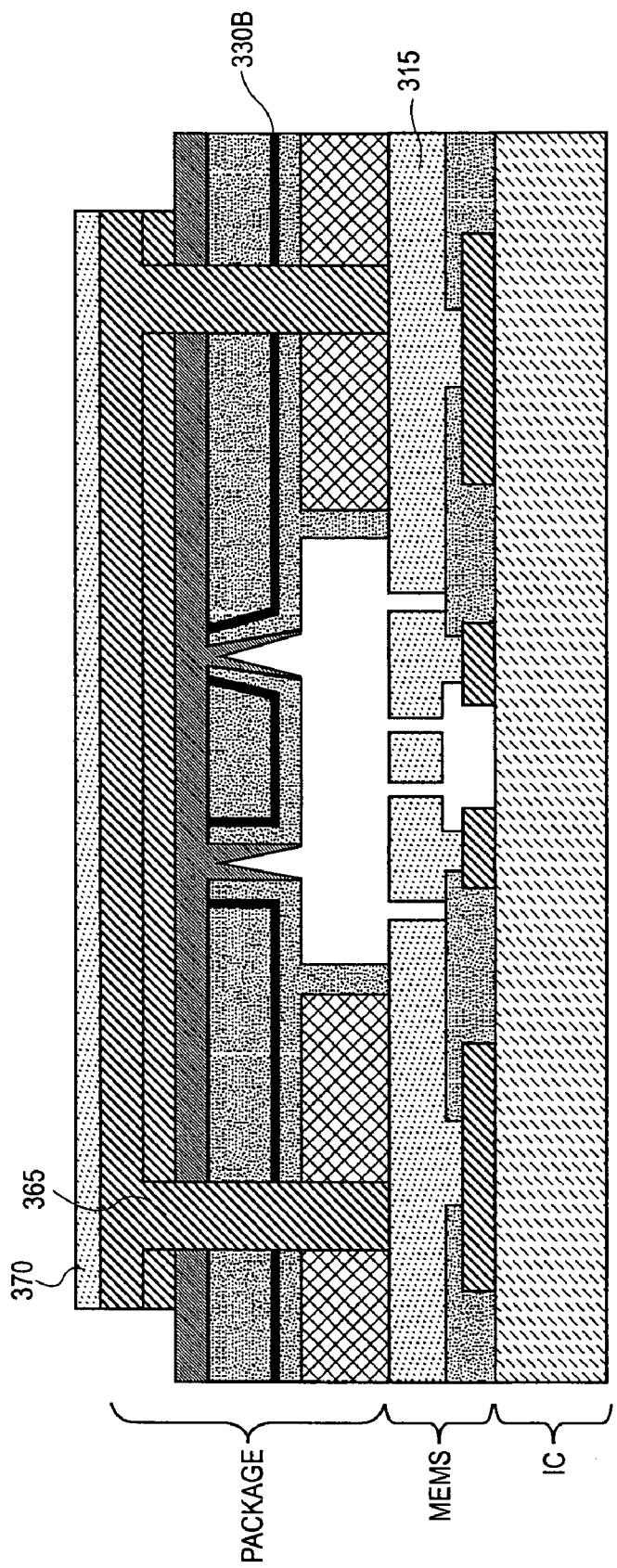

As further shown in the embodiment depicted in FIG. 3L, a semiconductor layer 370 may then be formed on conductive layer 365 to reinforce the microshell. In embodiments incorporating such a reinforcing layer, the semiconductor deposition is performed at a temperature below 500° C. to remain compatible with BEOL IC processing. In one such embodiment, an alloy of silicon and germanium is deposited at a temperature below 425° C. using a LPCVD process. In a further embodiment, a rapid thermal anneal (RTA) is performed to form a germanosilicide with conductive layer 365. It should be noted that semiconductor layer 370 is absent in particular embodiments of the present invention not requiring the additional strength provided by the semiconductor-metal alloy.

Finally, as shown in cross-section in FIG. 3L, conductive layer 365 and shell semiconductor layer 370 are patterned to delineate the completed microshell. Semiconductor layer 370, conductive layer 365 and hermetic layer 350B are selectively etched about the periphery of the microshell. At this time, layers 350B, 365 and 370 may also be patterned into pads for the packaged device or as a level of interconnect in a monolithically integrated IC process (i.e. final metal in a BEOL IC process). Thus, damascene fabrication of a highly planar, low temperature semiconductor-metal-insulator microshell has been described. The multi-layer microshell as described may be seamlessly integrated into the typical BEOL IC process or it may be preformed as a distinct process flow to mass fabricate discretely packaged devices that benefit from the microenvironment provided by the microshell. Furthermore, the flexibility fabricating a microshell in accordance with the present invention enables useful microshell configurations as well as useful integration with IC processes (such as CMOS), examples of both are described further below.

Figure 4A:
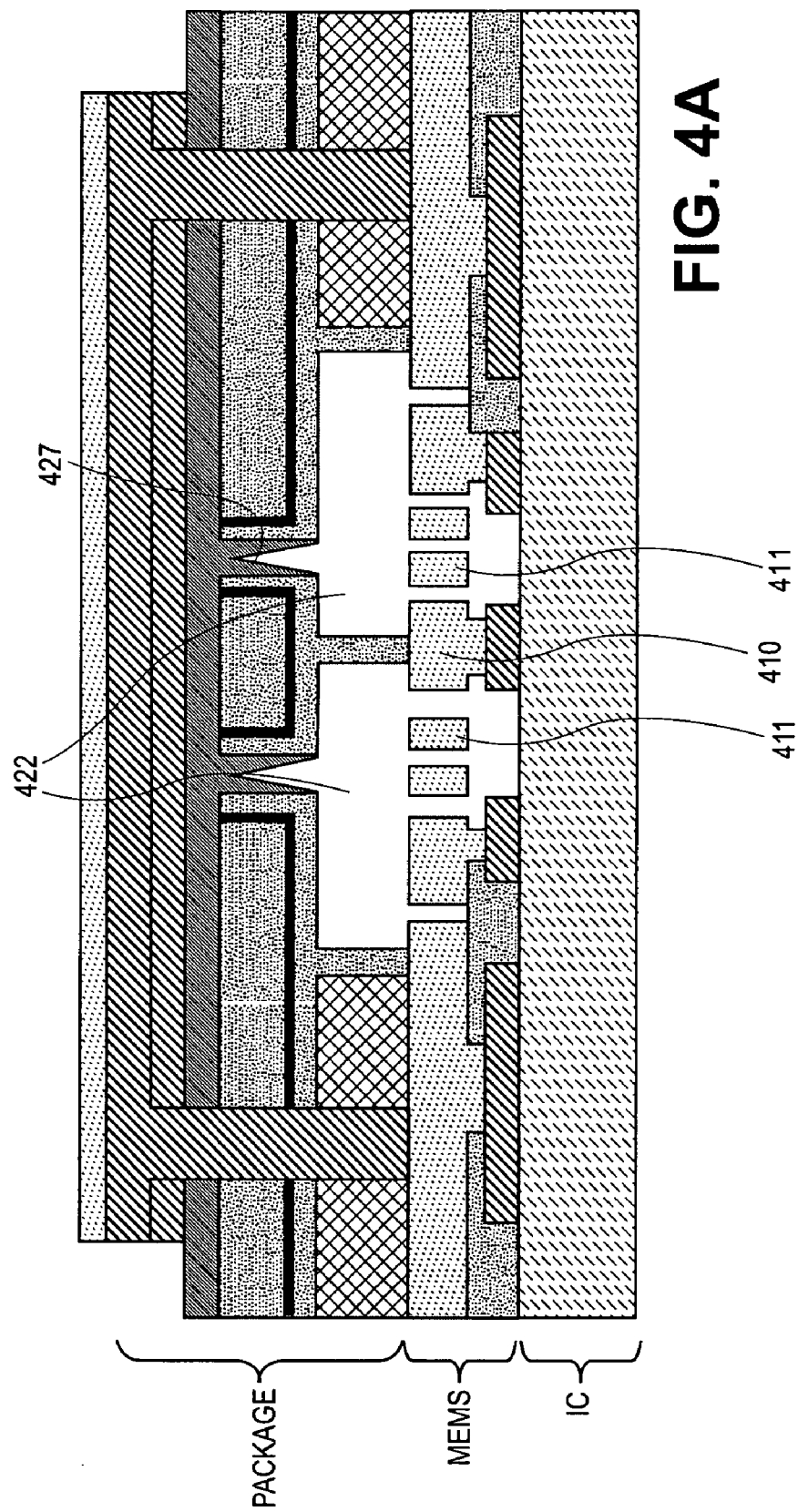
FIG. 4A is a cross-sectional view of a microshell encapsulating and anchoring a MEMS disposed within the microshell in accordance with an embodiment of the present invention.

Microshells in accordance with the present invention may be inexpensively scaled to have very large spans. With the modification of a single mask, support posts may be integrated into the microshell as needed to physically support such spans. FIG. 4A depicts an embodiment of a large microshell in accordance with the present invention. As shown, a large ring resonator 411 circumscribes drive/sense electrode 410. Drive/sense electrode 410 is further employed as a base for microshell support pillar 427. Microshell support pillar 427 is provided in the mask for the first damascene mold (as discussed in reference to FIG. 3C). Then, in addition to circumscribing the device, the trench 321 of FIGS. 3C and 3D is also selectively formed directly over drive/sense electrode 410 (FIG. 4). Thus, in such an embodiment the microshell size may be arbitrarily increased to accommodate a very large device or a plurality of devices within chamber 422.

Figure 4B:
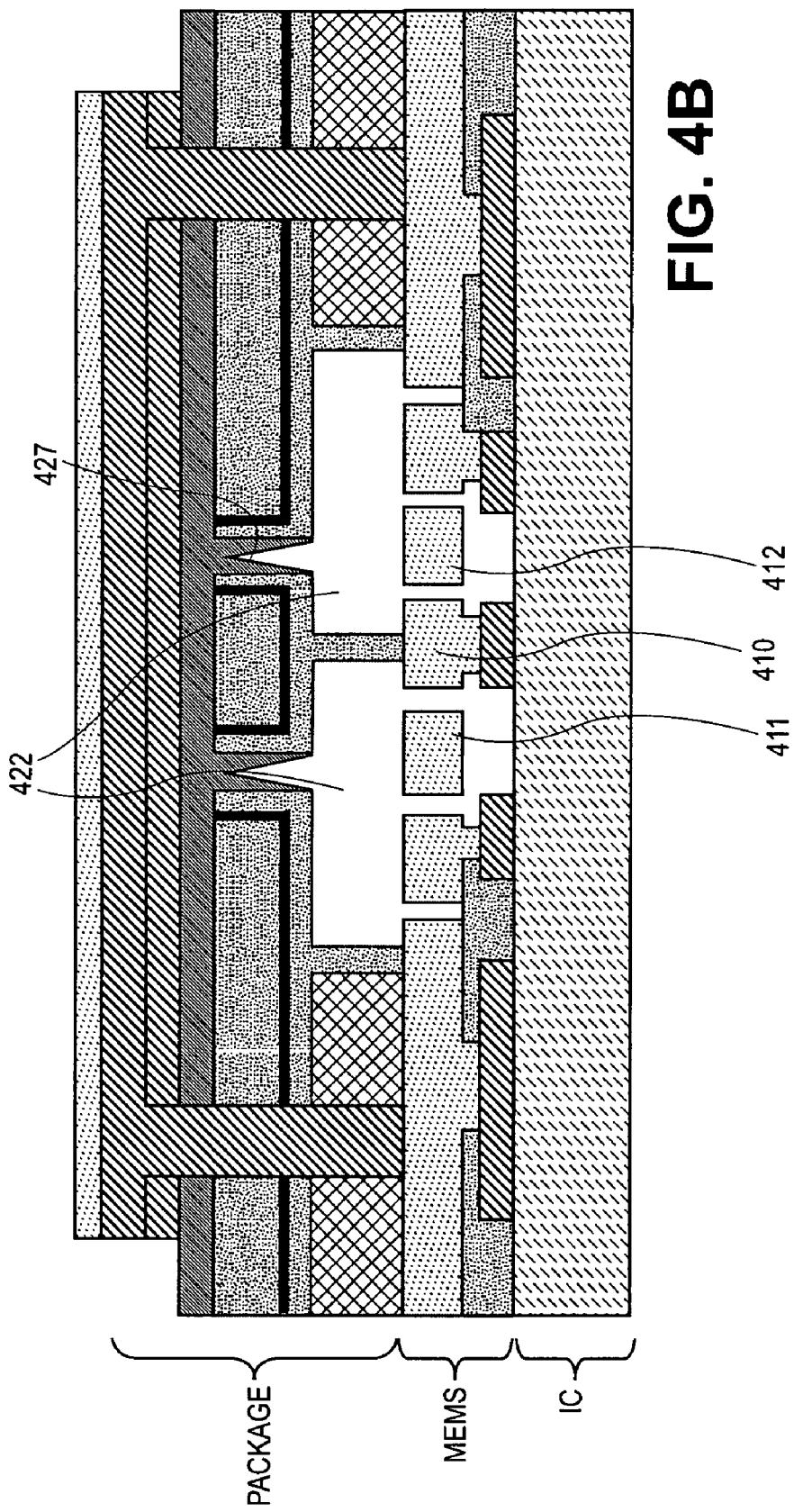
FIG. 4B is a cross-sectional view of a microshell encapsulating and anchoring a plurality of MEMS disposed within the microshell in accordance with an embodiment of the present invention.

In a further embodiment, a large microshell encapsulates a plurality of devices. As shown in FIG. 4B, chamber 422 encapsulates a first MEMS resonant member 411 and a second MEMS resonant member 412. In the particular embodiment shown, the two resonant members are adjacent to a common drive electrode 410, but they need not be. Here again, microshell support pillar 427 enables the microshell to span a large enough distance to encapsulate both resonant members without collapse. It should be appreciated that a plurality (i.e. 2, 3, . . . n) MEMS resonators having independent drive/sense electrodes may be disposed within a single microshell a similar fashion. In a further embodiment, a plurality of MEMS resonators, each having a different resonant frequency, are encapsulated within a single microshell. Such an embodiment advantageously increases packing density of the plurality and ensures the plurality of resonators have a substantially identical microenvironment.

Figure 5:
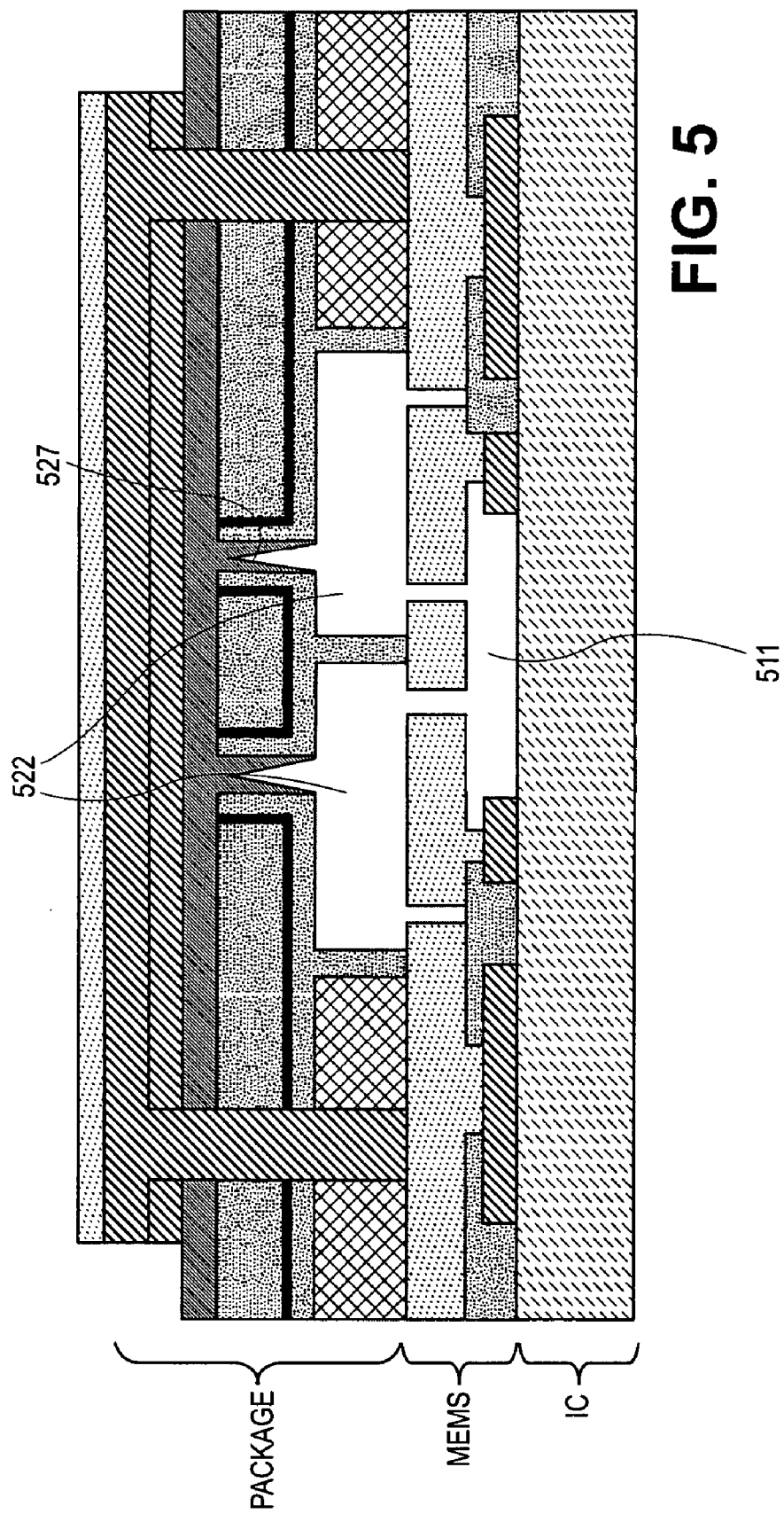
FIG. 5 is a cross-sectional view of a microshell encapsulating and anchoring a MEMS disposed within the microshell in accordance with an embodiment of the present invention.

Similarly, as shown in FIG. 5, the microshell as fabricated in accordance with the present invention may further be employed as an anchor for a MEMS element. For example, microshell anchor 527 is physically coupled to resonant member 511 disposed within chamber 522. Microshell anchor 527 is formed by including the anchor in the mask for the first damascene mold (as described in reference FIGS. 3C and 3D). In addition to circumscribing the device, trench 321 is formed directly over resonant member 511 (FIG. 5) to form microshell anchor 527. Then, as previously described in reference to FIG. 3H, the MEMS is released during or after chamber 522 is formed. Thus, with the addition of microshell anchor 527, resonant member 511 may be anchored either symmetrically or asymmetrically. A symmetrical anchor incorporates microshell anchor 527 in addition to an anchor to substrate 501 (not shown). An asymmetrical anchor incorporates only microshell anchor 527 with no anchoring directly to substrate 501. As one of skill in the art should appreciate, symmetrical anchoring of a resonant member can improve the resonance quality of the element while asymmetrical anchoring to the microshell can be useful for MEMS sensor applications or for any device requiring released interconnects (discussed further below).

Figure 6:
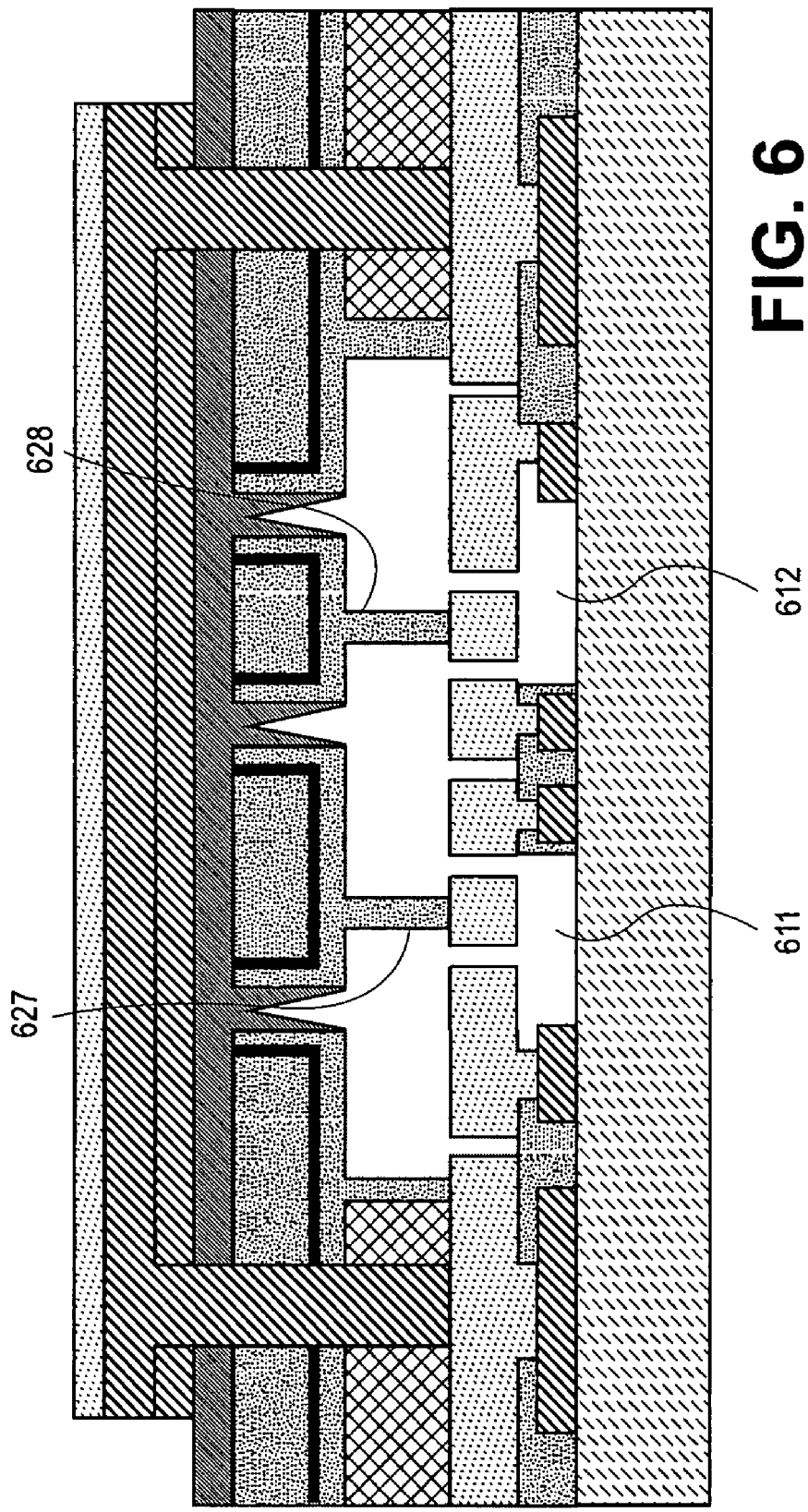
FIG. 6 is a cross-sectional view of a microshell encapsulating and mechanically coupling a plurality of MEMS disposed within the microshell in accordance with an embodiment of the present invention.

FIG. 6 further depicts a microshell mechanically coupling a plurality of MEMS. For example, resonant member 611 and resonant member 612 are each coupled to the microshell through microshell anchor 627 and 628, respectively. Because the microshell is a thin film, comparatively greater mechanical transmission is possible between resonant member 611 and 612 than if 611 and 612 are anchored through substrate 501.

Because microshells fabricated as described are compatible with most BEOL IC process (i.e. processing temperatures are below 500° C. to accommodate tight thermal budget of CMOS), MEMS packaged within the microshell may be coupled to CMOS devices on the same substrate. In one such embodiment, a monolithic timing circuit is formed incorporating a MEMS resonator as a clock reference, as is known in the art. In one such implementation, a CMOS voltage control oscillator (VCO) and phase lock loop (PLL) are monolithically integrated with the MEMS resonator clock packaged within the microshell. Thus, applying the microshell of the present invention, a monolithic MEMS-based timing circuit may be inexpensively mass fabricated.

Figure 7:
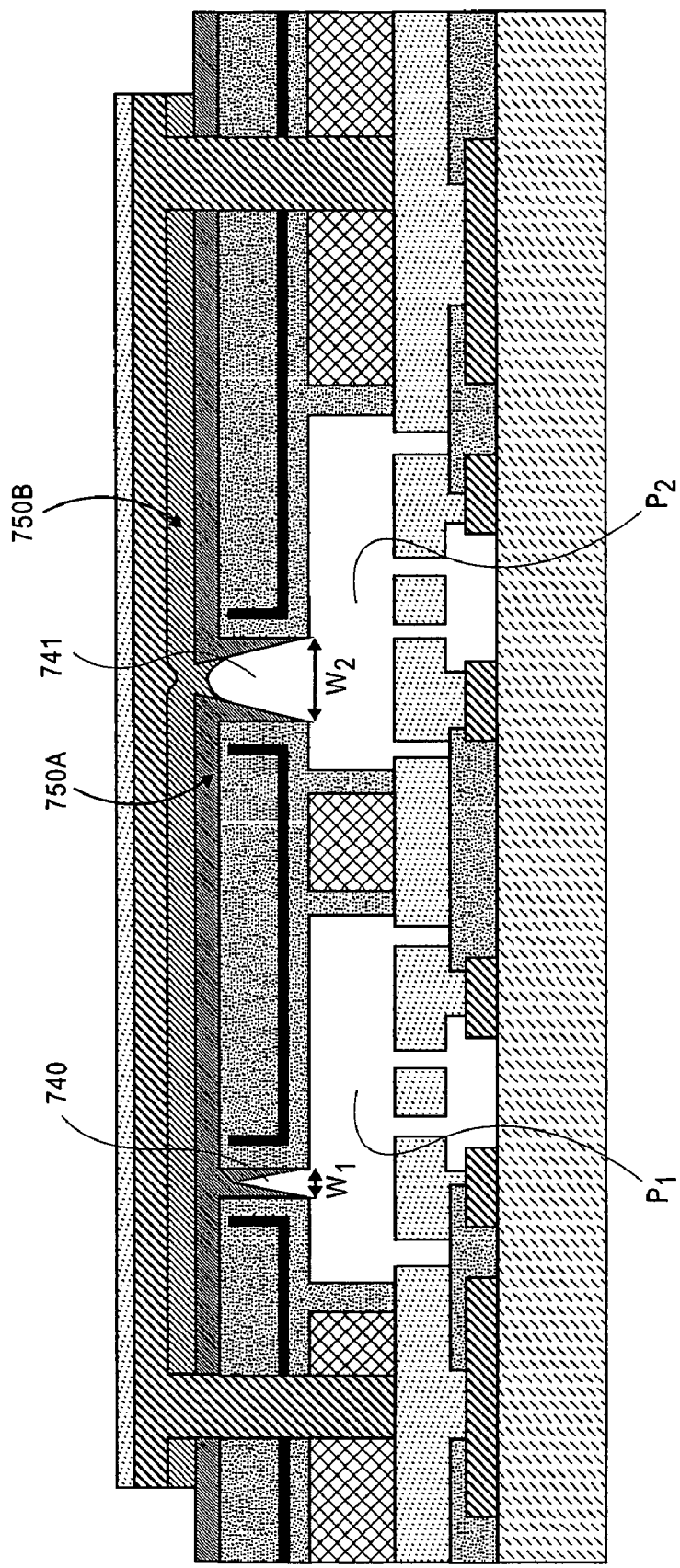
FIG. 7 is a cross-sectional view of a microshell encapsulating a MEMS disposed within chambers having different levels of vacuum in accordance with an embodiment of the present invention.
Figure 8:
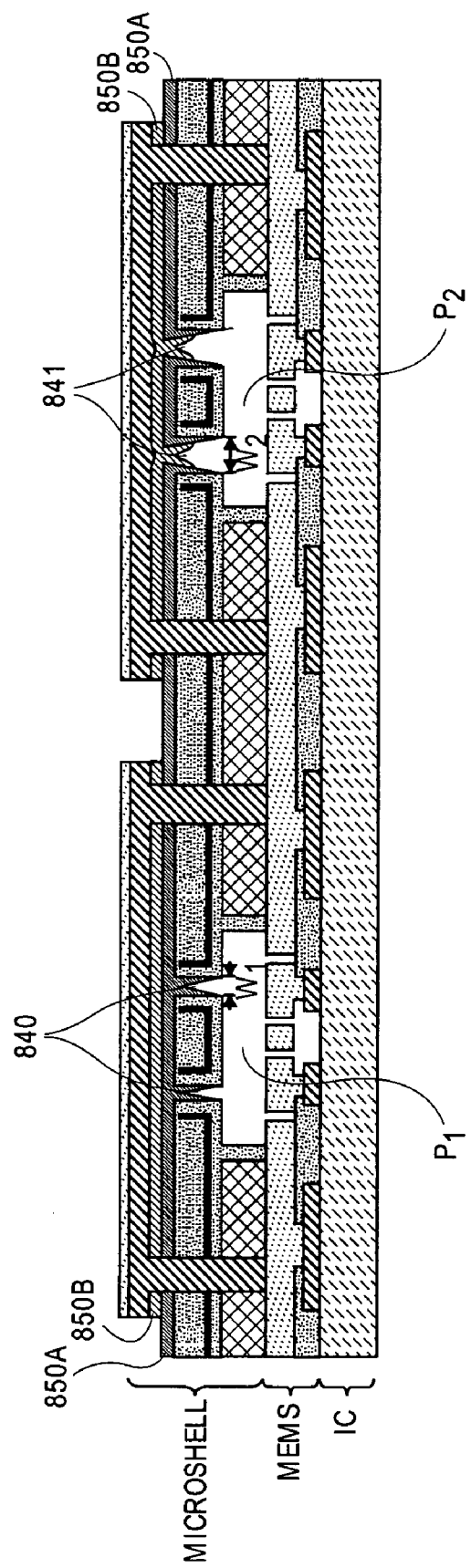
FIG. 8 is a cross-sectional view of a plurality of microshells each encapsulating a MEMS disposed within chambers having different levels of vacuum in accordance with an embodiment of the present invention.

Embodiments of the present invention include a plurality of chambers having different vacuum levels on a single substrate, as shown in FIGS. 7 and 8. Multi-level vacuum chambers on a single substrate enable a low pressure device, such as a resonator, to be integrated with a higher pressure device, such as an accelerometer. To form multi-level vacuum chambers on one substrate, apertures for a plurality of chambers are selectively occluded based on the size of the aperture. In such an embodiment, apertures of different dimension are fabricated using the methods previously described so that differing amounts of sealing layer 250 are required to seal the various apertures.

As shown in FIG. 7, a single microshell contains a plurality of chambers. A first chamber has aperture 740 of a dimension $W_1$ while a second chamber has aperture 741 of a dimension $W_2$, significantly larger than $W_1$. Because $W_2$ is significantly larger than $W_1$, more material is required to occlude aperture 741 than aperture 740, thereby enabling aperture 740 to be occluded with a first set of process conditions and aperture 741 to be occluded with a second set of process conditions. As shown in FIG. 7, aperture 740 is occluded with occluding layer 750A while aperture 741 is occluded with hermetic layer 750B. Thus, the different process conditions employed for the formation of the occluding layer 750A and hermetic layer 750B provide different levels of vacuum ($P_1$ and $P_2$) across the plurality of chambers. In one embodiment, for example, a MEMS accelerometer is enclosed in the first chamber occluded with occluding layer 750A at a pressure of approximately 300 mT. To further increase the chamber pressure, $P_1$, after occluding layer 750A occludes aperture 740, additional gaseous or thermal processing may be performed, such as elevated temperature bakes to pressurize via outgassing or in-gassing. The duration of such processing is dependent on the leak rate of occluding layer 750A, which may be on the order of seconds, minutes, hours, or a few days. In a particular embodiment, $P_1$ is allowed to leak up reach a predetermined pressure over the course of a number of hours based on the leak rate provided by occluding layer 750A. The occluding layer 750A then serves to retain this high pressure, $P_1$, desirable for the MEMS accelerometer while the second chamber, not yet occluded, is pumped down to a second vacuum or pressure level, $P_2$, appropriate for a MEMS resonator (6 mT, for example). At pressure, $P_2$, aperture 741 is then occluded and sealed with hermetic layer 750B, thereby providing a plurality of hermetically sealed chambers at a plurality of vacuum levels.

Similarly, as shown in FIG. 8, a first microshell with a chamber has an aperture 840 of a dimension $W_1$ while a second microshell with a second chamber has aperture 841 with a dimension $W_2$, significantly larger than $W_1$. Here each of the plurality of microshells contains a single chamber at a vacuum level different from the other microshell. Because $W_2$ is significantly larger than $W_1$, more material is required to occlude aperture 841 than aperture 840, thereby enabling aperture 840 to be occluded with a first set of process conditions and aperture 841 to be occluded with a second set of process conditions. In a specific embodiment, the first set of process conditions include a first pressure, $P_1$, that is higher than a second pressure, $P_2$, in a second set of process conditions to form a first chamber with a pressure of $P_1$ and second chamber with a pressure of $P_2$ on a single substrate.

As further shown in FIG. 8, aperture 840 is occluded with nonhermetic layer 850A while aperture 841 is occluded with hermetic layer 850B. In one such embodiment, nonhermetic layer 850A is a dielectric, such as an oxide of silicon, while hermetic layer 850B is a metal, such as aluminum. Thus, in this embodiment, one chamber pressure, $P_1$, is equal to the dielectric deposition pressure and another chamber pressure, $P_2$, is equal to the metal deposition pressure. In an alternate embodiment, both apertures 840 and 841 are occluded with nonhermetic layer 850A. In such an implementation, aperture 840 may be occluded during a first step depositing a portion of nonhermetic layer 850A at a first pressure $P_1$, and aperture 840 may be occluded during a second step depositing a portion of nonhermetic layer 850A at a second pressure, $P_2$.

Figure 9A:
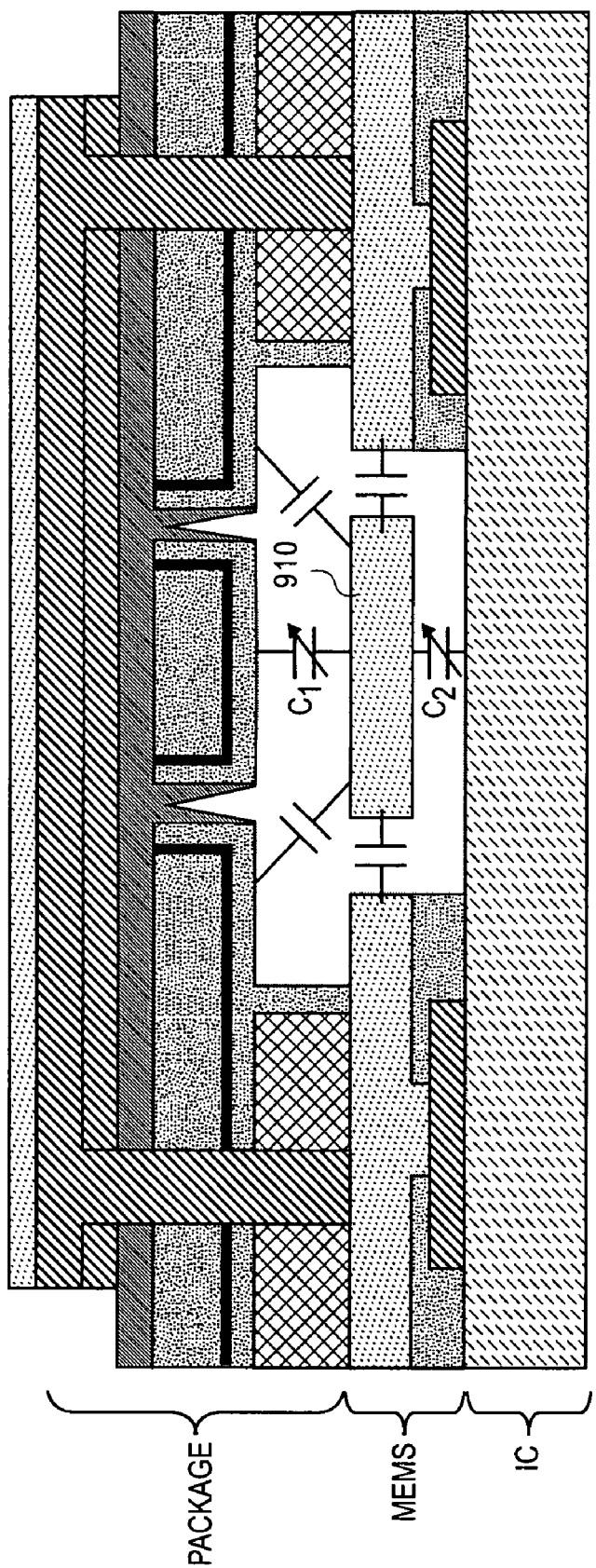
FIG. 9A is a cross-sectional view of a microshell encapsulating a released interconnect structure disposed within the microshell to form a varactor in accordance with an embodiment of the present invention.
Figure 9B:
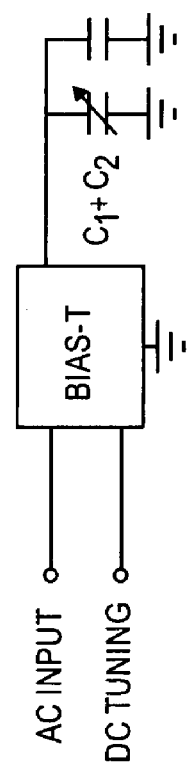
FIG. 9B is a schematic of one port capacitor employing the MEMS disposed within the microshell in accordance with the embodiment of the present invention depicted in FIG. 9A.

Generally, because microshells in accordance with the present invention can encapsulate and anchor released interconnects, various capacitors, inductors and transmission lines may be provided with only slight variations beyond what has already been described. For example, as shown in FIGS. 9A and 9B, because microshells in accordance with the present invention can be electrically grounded, the microshells may serve as a plate in a capacitor. As one example, the grounded metal-insulator microshell may be used to form a lumped-element one-port capacitor, where MEMS structure 910 serves as the non-ground plate and the microshell is the ground plate of the capacitor. This capacitor has a dielectric including the insulator of pre-sealing layer and the air in chamber. Therefore, a variable capacitance, $C_1+C_2$, may be tuned by applying a DC bias voltage to MEMS structure 910. For example as shown in FIG. 9B, for a MEMS resonator having an AC input, a DC bias voltage is provided through a bias-T to additionally provide a tunable capacitance between the resonator member and grounded microshell. This ability to form a capacitor between MEMS structure 910 and the microshell can be used in tuning MEMS control circuitry or provide a tunable capacitor that can be employed in any number of commonly known IC that are integrated with the microshell.

Figure 10A:
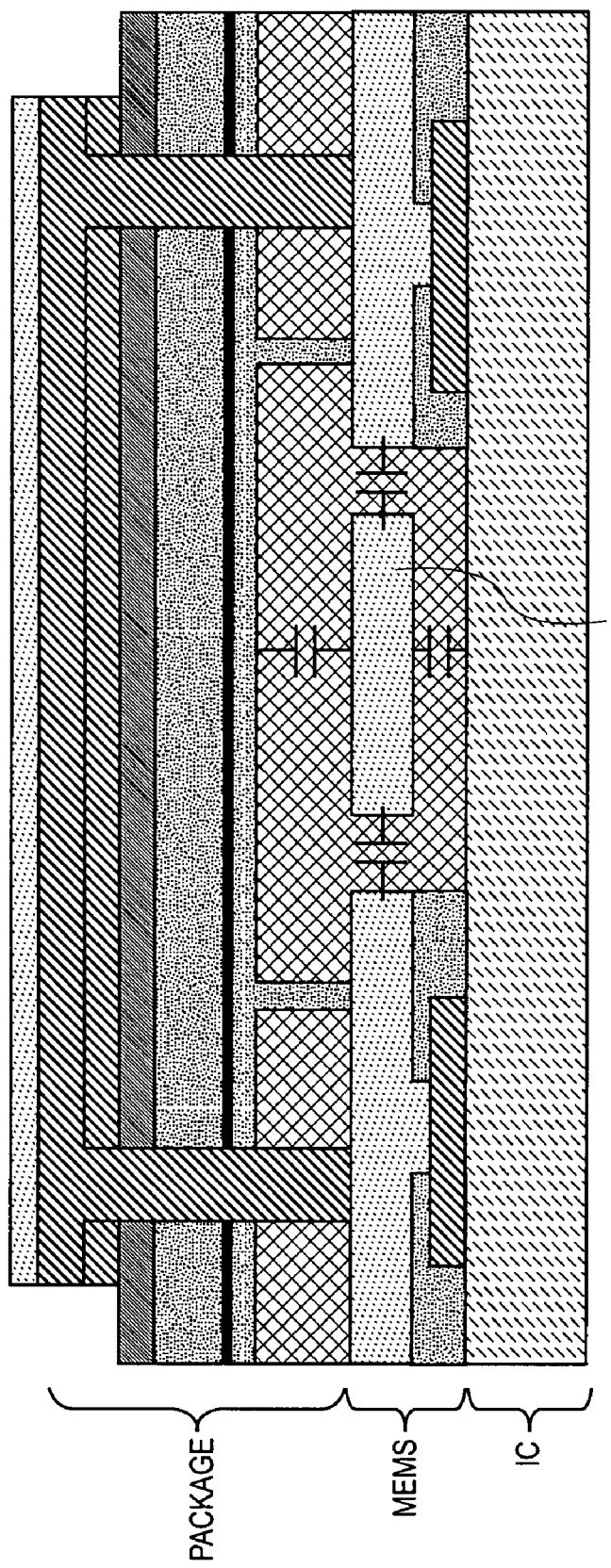
FIG. 10A a cross-sectional view of a microshell encapsulating an unreleased structure disposed within the microshell to form a fixed capacitor in accordance with an embodiment of the present invention.
Figure 10B:
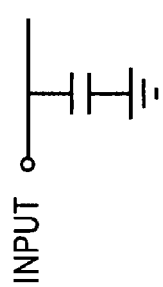
FIG. 10B is a schematic of the fixed capacitor depicted in FIG. 10A.

Similarly, as shown in FIG. 10A, the grounded microshell may also be employed as a fixed capacitor shown in schematic from in FIG. 10B. By encapsulating interconnect 1010 in a microshell having no apertures, interconnect 1010 is not released and a fixed capacitance between interconnect 1010 and the ground microshell is provided. The value of the capacitance depends on the length and width of interconnect 1010 and the thickness and dielectric parameters of the between the microshell and interconnect 1010. The ground potential may additionally be provided by the embedded getter layer to place the ground plane in closest proximity to interconnect 1010.

Figure 11A:
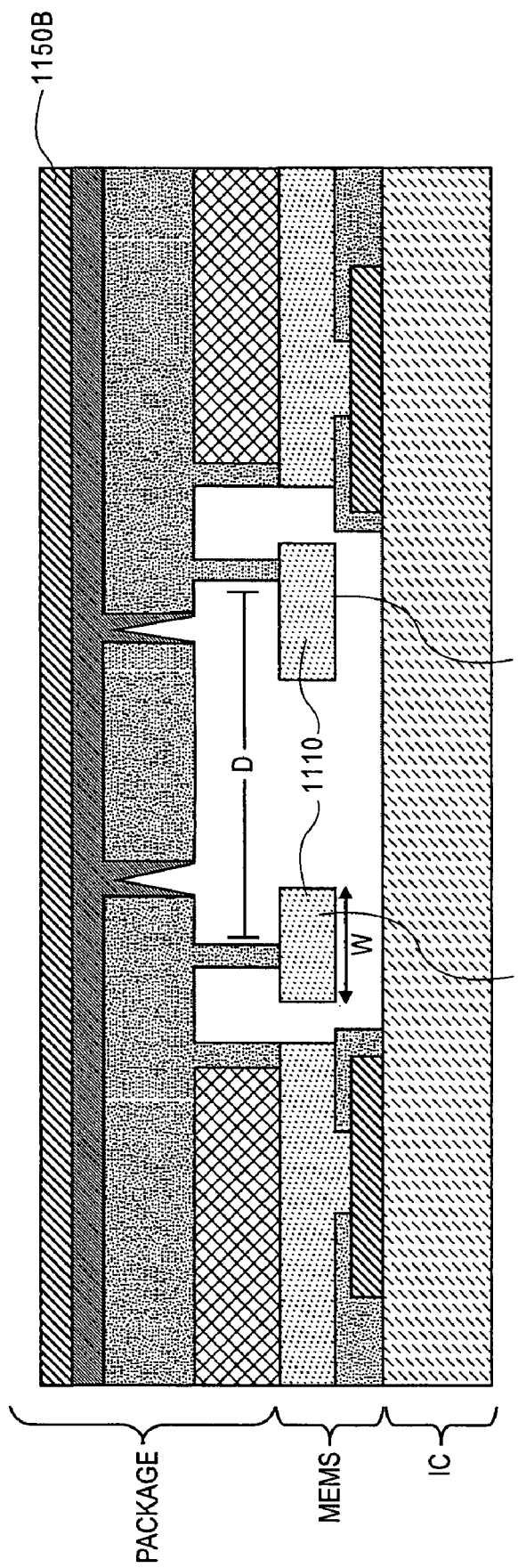
FIG. 11A is a cross-sectional view of a microshell encapsulating a released interconnect structure disposed within the microshell to form an inductor in accordance with an embodiment of the present invention.
Figure 11B:
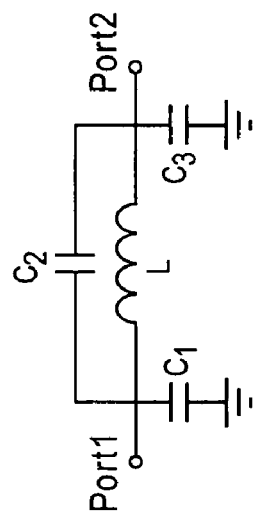
FIG. 11B is a schematic of the inductor depicted in FIG. 11A.

Furthermore, as shown in FIG. 11A, a non-grounded microshell in accordance with the present invention anchors a released interconnect forming an encapsulated inductor in a two-port configuration. The inductance value is determined by the diameter, D, width, W of suspended inductor interconnect 1110 in addition to the dielectric parameters. As known in the art, high Q inductors are difficult to fabricate on the micro-scale due to large parasitic capacitances. Because the microshell (package), as shown, anchors a released inductor interconnect 1110 from above rather than directly to the substrate, parasitic capacitances between the inductor and surrounding films as well as between inductor and the substrate are reduced. More specifically, as shown in the schematic of FIG. 11B, the capacitors $C_1$ and $C_3$ are the ground to inductor parasitic capacitances and the capacitor $C_2$ is the parasitic capacitance between inductor windings. Thus, to further minimize parasitic capacitance, as shown in FIG. 11A, the microshell is not grounded. In such an embodiment, hermetic layer 1150B is not a metal, but rather an insulator such as silicon dioxide, silicon nitride, polyimide, or other commonly known film capable of providing hermeticity. Furthermore, no additional metal is deposited to contact a ground ring or plane below the microshell (as opposed to the grounded microshell of FIG. 2A). Because microshells in accordance with the present invention may readily provide both large capacitors and inductors, inductor-capacitor (LC) filters commonly known in the art may be fabricated for use by circuitry in the IC region below the MEMS and microshell (package) levels.

Figure 12A:
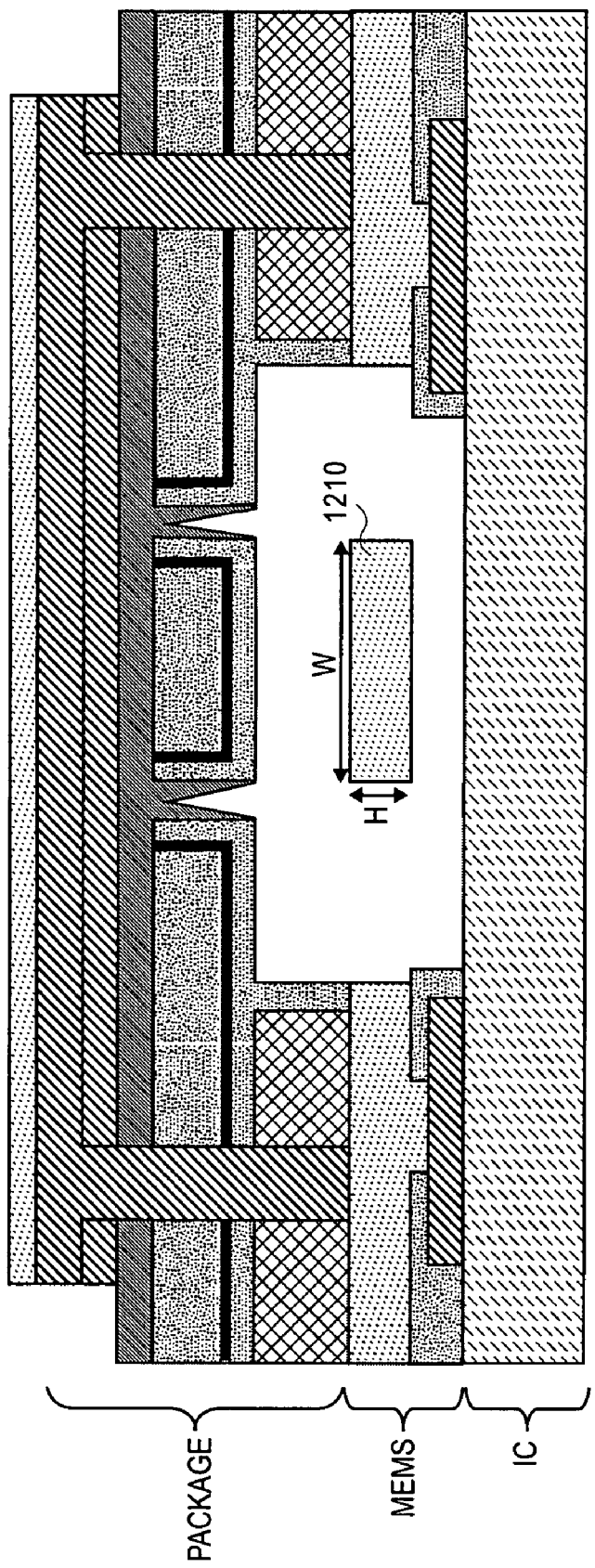
FIG. 12A is a cross-sectional view of a microshell encapsulating a released interconnect structure disposed within the microshell to form a microstrip transmission line in accordance with an embodiment of the present invention.
Figure 12B:
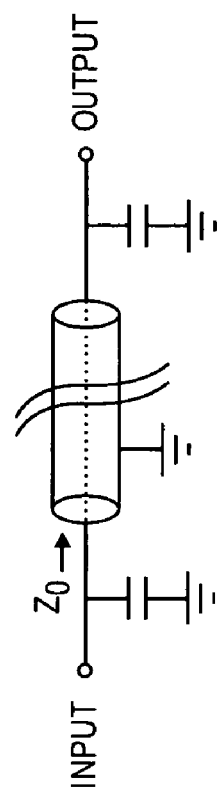
FIG. 12B is a schematic of the microstrip transmission line depicted in FIG. 12A.
Figure 13:
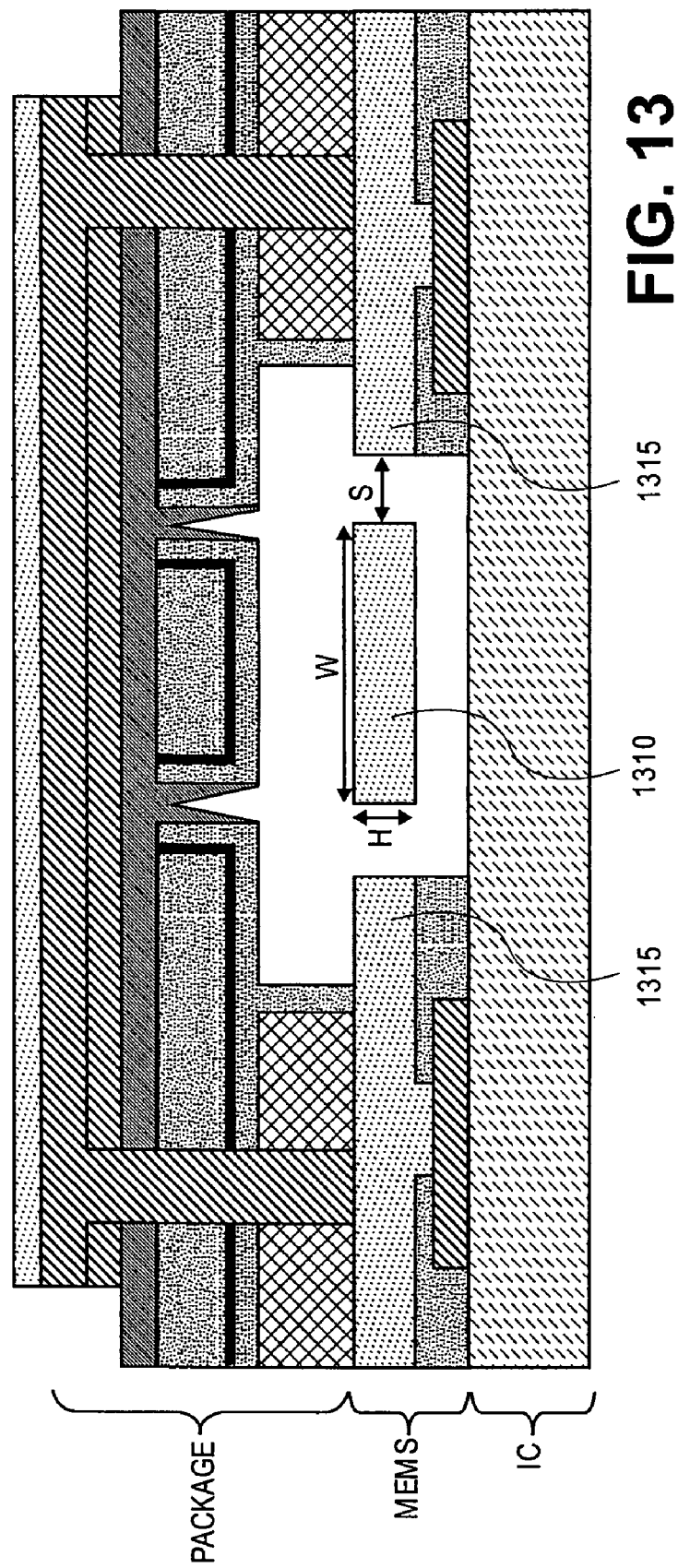
FIG. 13 is a cross-sectional view of a microshell encapsulating a released interconnect structure disposed within the microshell to form a coplanar waveguide transmission line in accordance with an embodiment of the present invention.

Further shown in FIG. 12A and FIG. 12B is a microshell in accordance with the present invention serving as a microstrip transmission line. In this configuration, a released interconnect 1210 carrying signal combines with the grounded microshell to form a microstrip transmission line having characteristic impedance, $Z_0$, determined by the line width, W, line height, H, and dielectric parameters. Similarly, as shown in FIG. 13, another embodiment employs the microshell of the present invention in a coplanar waveguide configuration. The combination of the signal interconnect 1310 released from the surrounding ground lines 1315 defines a transmission line having characteristic impedance, $Z_0$, determined by the line width, W, line separation, S, line height, H, and dielectric parameters. Thus, microshell encapsulated released interconnects may be configured in many ways and employed by MEMS and/or ICs integrated on the same substrate as the microshell.

Although the present invention has been described in language specific to structural features and/or methodological acts, it is to be understood that the invention defined in the appended claims is not necessarily limited to the specific features or acts described. For example, many applications may benefit from microshells in accordance with the present invention and one of ordinary skill in the art would recognize the embodiments described as particularly graceful implementations of the claimed invention useful for illustrating the present invention.

We claim:
1. A microshell comprising:
 a perforated pre-sealing layer to partially enclose a chamber on a substrate, the perforated pre-sealing layer including at least one perforation defined therein that is offset in position from a released MEMS structure enclosed within the chamber; and
 a sealing layer on the pre-sealing layer to close the perforation, wherein the sealing layer further comprises:
  a non-hermetic occluding layer to occlude the perforation; and
  a metal hermetic layer to seal the perforation.
2. The microshell of claim 1, wherein the pre-sealing layer contacts a MEMS structural element to provide asymmetrical anchoring to the released MEMS structure.
3. The microshell of claim 1, wherein the pre-sealing layer contacts a plurality of MEMS resonant members within the microshell to mechanically couple the plurality.
4. The microshell of claim 1, wherein the pre-sealing layer includes a plurality of perforations defined therein, with adjacent perforations of the plurality of perforations defined in the pre-sealing layer being offset relative to each other to form a staggered perforation pattern that is defined in the pre-sealing layer.
5. The microshell of claim 1, wherein the microshell has a sidewall; and wherein the pre-sealing layer forms at least a portion of the sidewall of the chamber.
6. The microshell of claim 1, wherein the pre-sealing layer further comprises a gas permeable layer.
7. The microshell of claim 6, wherein the gas permeable layer is an oxide of silicon.
8. The microshell of claim 1, wherein the occluding layer comprises a dielectric.
9. The microshell of claim 8, wherein the dielectric is an oxide of silicon.
10. The microshell of claim 1, wherein the hermetic layer comprises aluminum.
11. The microshell of claim 1, wherein the microshell has an outer sidewall; and wherein the hermetic layer is electrically coupled to a conductive layer extending down the outer sidewall of the microshell.
12. The microshell of claim 11, wherein the conductive layer is electrically coupled to a ground ring to electrically ground the microshell.
13. The microshell of claim 12, wherein the sealing layer comprises a semiconductor layer over the hermetic layer to reinforce the shell.
14. The microshell of claim 13, wherein the semiconductor layer comprises an alloy of silicon and germanium to form a germanosilicide with the hermetic layer.
15. The microshell of claim 1, wherein the perforation has an aspect ratio greater than 8:1 height to width ratio.
16. The microshell of claim 15, wherein the perforation is above the chamber.
17. A method of forming a microshell comprising:
 forming a non-planar sacrificial layer over a substrate and over a structural component of a MEMS;
 forming a pre-sealing layer over the non-planar sacrificial layer;
 planarizing the pre-sealing layer to perforate the pre-sealing layer with a topographic feature of the non-planar sacrificial layer to form a perforated pre-sealing layer including at least one perforation defined therein that is offset in position from the MEMS structure;
 removing the non-planar sacrificial layer through the perforation to release the structural component of a MEMS within a chamber and form the chamber around the MEMS structure under the pre-sealing layer, the perforated pre-sealing layer including at least one perforation defined therein that is offset in position from the released MEMS structure enclosed within the chamber; and
 sealing the per-sealing layer with a sealing layer on the pre-sealing layer to close the perforation, wherein the sealing layer comprises:

a non-hermetic occluding layer to occlude the perforation, and a metal hermetic layer to seal the perforation.

18. The method of claim 17, wherein the sacrificial material is formed of the same material as a release layer surrounding the structural component.

19. The method of claim 18, wherein forming the sacrificial material further comprises depositing the sacrificial material at a temperature below 450° C.

20. The method of claim 19, wherein forming the sacrificial material further comprises depositing germanium.

21. The method of claim 20, wherein forming the sacrificial material further comprises depositing an etch stop layer between a first and second layer of germanium.

22. The method of claim 17, wherein forming the non-planar sacrificial layer further comprises:

forming a sacrificial material over the substrate;

etching the sacrificial material with a first mask to define an edge of the chamber;

etching the sacrificial material with a second mask to form an isolated sacrificial layer having a blade of sacrificial material extending upwards from the substrate.

23. The method of claim 22, wherein the second mask defines staggered rows of blades to form a crenelated sacrificial layer such that planarizing the pre-sealing layer perforates the pre-sealing layer to define a plurality of perforations therein, with adjacent perforations of the plurality of perforations defined in the pre-sealing layer being offset relative to each other to form a staggered perforation pattern that is defined in the pre-sealing layer.

24. The method of claim 22, wherein the sacrificial material is etched to have a sloped blade profile.

25. The method of claim 22, wherein forming the pre-sealing layer over the non-planar sacrificial layer further comprises depositing a dielectric pre-sealing layer over the non-planar sacrificial layer to cover the blade and chamber edge.

26. The method of claim 22, wherein forming the pre-sealing layer over the non-planar sacrificial layer further comprises depositing a getter layer over the non-planar sacrificial layer to cover the blade.

27. The method of claim 22, wherein forming the pre-sealing layer over the non-planar sacrificial layer further comprises depositing over the non-planar sacrificial layer a first dielectric layer and a second dielectric layer with a getter layer there between.

28. The method of claim 22, further comprising forming the microshell to have an outer sidewall and a conductive layer extending down the outer sidewall of the microshell; and forming the hermetic layer to be electrically coupled to the conductive layer extending down the outer sidewall of the microshell.

29. The method of claim 22, wherein the non-planar sacrificial layer is removed with hydrogen peroxide.

30. The method of claim 17, wherein sealing the pre-sealing layer further comprises:

nonconformally depositing a dielectric to physically occlude the perforation; and depositing a metal to hermetically seal the perforated pre-sealing layer.

31. The method of claim 30, wherein the chamber is heated for at least 30 seconds to a temperature above 400° C. before depositing the dielectric to desorb contaminants.

32. The method of claim 30, wherein the dielectric is deposited with the substrate tilted by a small angle relative to a predominant material flux within the deposition chamber to reduce back-deposition of the sealing material.

33. The method of claim 17, further comprising:

etching through the sealing layer to expose a metal ground ring adjacent to the chamber; and depositing a conductive layer on the sealing layer and ground ring to electrically ground the microshell.

34. The method of claim 17, further comprising:

depositing a semiconductor over the conductive layer to structurally reinforce the microshell.

35. The method of claim 34, wherein the semiconductor comprises germanium to form a germanosilicide.

36. An apparatus comprising:

a grounded metal-insulator microshell comprising:

a perforated pre-sealing layer to partially enclose a chamber on a substrate, the perforated pre-sealing layer including at least one perforation defined therein that is offset in position from a released MEMS structure enclosed within the chamber;

a non-hermetic occluding layer to occlude the perforation;

a metal hermetic sealing layer on the pre-sealing layer to close the perforation; and on the sealing layer, a conductive layer electrically coupled to a ground ring adjacent to the metal-insulator microshell; and a released interconnect structure encapsulated by the grounded metal-insulator microshell.

37. The apparatus of claim 36, further comprising a CMOS device on the substrate electrically coupled to the released interconnect structure.

38. The apparatus of claim 37, wherein the released interconnect structure is a MEMS resonator.

39. The apparatus of claim 37, wherein the CMOS device is a timing circuit including a voltage controlled oscillator and a phase-lock loop.

40. The apparatus of claim 36, wherein the released interconnect structure forms a one-port capacitor with the grounded metal-insulator microshell.

41. The apparatus of claim 36, wherein the released interconnect structure forms an inductor.

42. The apparatus of claim 36, wherein the released interconnect structure forms a microstrip or coplanar waveguide transmission line.

43. A microshell comprising:

a perforated pre-sealing layer to partially enclose a chamber on a substrate; and a sealing layer on the pre-sealing layer to close a perforation, wherein the sealing layer further comprises:

a non-hermetic occluding layer to occlude the perforation; and a metal hermetic layer to seal the perforation;

wherein the microshell has an outer sidewall; and wherein the hermetic layer is electrically coupled to a conductive layer extending down the outer sidewall of the microshell.

44. The microshell of claim 43, wherein the conductive layer is electrically coupled to a ground ring to electrically ground the microshell.

45. The microshell of claim 44, wherein the sealing layer comprises a semiconductor layer over the hermetic layer to reinforce the shell.

46. The microshell of claim 45, wherein the semiconductor layer comprises an alloy of silicon and germanium to form a germanosilicide with the hermetic layer.

47. The microshell of claim 43, wherein the pre-sealing layer includes a plurality of perforations defined therein, with adjacent perforations of the plurality of perforations defined in the pre-sealing layer being offset relative to each other to form a staggered perforation pattern that is defined in the pre-sealing layer.

48. The microshell of claim 43, wherein the microshell has a sidewall; and wherein the pre-sealing layer forms at least a portion of the sidewall of the chamber.

49. The microshell of claim 43, wherein the pre-sealing layer further comprises a gas permeable layer.

50. The microshell of claim 49, wherein the gas permeable layer is an oxide of silicon.

51. The microshell of claim 43, wherein the occluding layer comprises a dielectric.

52. The microshell of claim 51, wherein the dielectric is an oxide of silicon.

53. The microshell of claim 43, wherein the hermetic layer comprises aluminum.

54. A microshell comprising:
a perforated pre-sealing layer to partially enclose a chamber on a substrate; and
a sealing layer on the pre-sealing layer to close a perforation, wherein the sealing layer further comprises:
   a non-hermetic occluding layer to occlude the perforation; and
   a metal hermetic layer to seal the perforation;
wherein the pre-sealing layer includes a plurality of perforations defined therein, with adjacent perforations of the plurality of perforations defined in the pre-sealing layer being offset relative to each other to form a staggered perforation pattern that is defined in the pre-sealing layer.

* * * * *